(12) United States Patent
Haneda et al.

(10) Patent No.: US 11,662,441 B2
(45) Date of Patent: May 30, 2023

(54) CIRCUIT DEVICE, PHYSICAL QUANTITY MEASURING DEVICE, ELECTRONIC APPARATUS, AND VEHICLE

(71) Applicant: Seiko Epson Corporation, Tokyo (JP)

(72) Inventors: Hideo Haneda, Matsumoto (JP); Akio Tsutsumi, Chino (JP)

(73) Assignee: SEIKO EPSON CORPORATION

( * ) Notice: Subject to any disclaimer, the term of this patent is extended or adjusted under 35 U.S.C. 154(b) by 1278 days.

(21) Appl. No.: 16/045,899

(22) Filed: Jul. 26, 2018

(65) Prior Publication Data

US 2019/0033431 A1 Jan. 31, 2019

(30) Foreign Application Priority Data

Jul. 27, 2017 (JP) .............................. JP2017-145069

(51) Int. Cl.
| | | |
|---|---|---|
| *G01S 7/4861* | (2020.01) | |
| *H03F 3/45* | (2006.01) | |
| *H03F 3/68* | (2006.01) | |
| *G01S 17/06* | (2006.01) | |
| *G04F 10/00* | (2006.01) | |

(Continued)

(52) U.S. Cl.
CPC ............ *G01S 7/4861* (2013.01); *G01S 17/06* (2013.01); *G01S 17/931* (2020.01); *G04F 10/005* (2013.01); *H03F 3/45071* (2013.01); *H03F 3/68* (2013.01); *H03F 2200/129* (2013.01); *H03F 2200/156* (2013.01); *H03F 2200/231* (2013.01); *H03F 2200/267* (2013.01); *H03F 2200/297* (2013.01); *H03F 2200/414* (2013.01); *H03F 2203/45156* (2013.01); *H03M 1/12* (2013.01); *H03M 1/1225* (2013.01)

(58) Field of Classification Search
CPC ...... G01S 7/4861; G01S 17/931; G01S 17/06; G04F 10/005; H03F 3/45071; H03F 3/68; H03F 2200/129; H03F 2200/156; H03F 2200/231; H03F 2200/267; H03F 2200/297; H03F 2200/414; H03F 2203/45156; H03M 1/12; H03M 1/1225
See application file for complete search history.

(56) References Cited

U.S. PATENT DOCUMENTS

| | | | |
|---|---|---|---|
| 9,413,373 B1 * | 8/2016 | Ishii ..................... | H03M 1/1061 |
| 2013/0128257 A1 * | 5/2013 | Stettner .................. | G01S 17/06 |
| | | | 356/4.01 |

(Continued)

FOREIGN PATENT DOCUMENTS

| | | | |
|---|---|---|---|
| JP | 2008236420 A | * | 10/2008 |
| JP | 2010-286307 A | | 12/2010 |
| KR | 20140122553 A | * | 10/2014 |

*Primary Examiner* — Luke D Ratcliffe
(74) *Attorney, Agent, or Firm* — Harness, Dickey & Pierce, P.L.C.

(57) ABSTRACT

A circuit device includes an analog front-end circuit that receives a target signal is input, and a processing circuit that performs arithmetic processing based on an output signal from the analog front-end circuit. The analog front-end circuit includes a plurality of comparator circuits that compare the voltage level of the target signal to a plurality of threshold voltages and output a plurality of comparison result signals. The processing circuit obtains the transition timing of the target signal based on the comparison result signals and delayed-time information of the analog front-end circuit.

15 Claims, 14 Drawing Sheets

(51) Int. Cl.
*G01S 17/931* (2020.01)
*H03M 1/12* (2006.01)

(56) References Cited

U.S. PATENT DOCUMENTS

| | | | |
|---|---|---|---|
| 2013/0215302 A1* | 8/2013 | Ueno | H03K 5/08 |
| | | | 348/300 |
| 2015/0124242 A1* | 5/2015 | Pierce | G01S 17/06 |
| | | | 356/5.01 |
| 2016/0003946 A1* | 1/2016 | Gilliland | G01S 7/4816 |
| | | | 356/5.01 |
| 2016/0313445 A1* | 10/2016 | Bailey | G01S 7/4816 |
| 2017/0115393 A1* | 4/2017 | Nagai | G01S 17/10 |
| 2018/0259627 A1* | 9/2018 | Shinozuka | G01S 7/4861 |
| 2018/0259629 A1* | 9/2018 | Oohata | G01S 17/10 |
| 2018/0267480 A1* | 9/2018 | Mahajan | G04F 10/005 |
| 2018/0267481 A1* | 9/2018 | Kondo | G01S 7/4865 |
| 2019/0178996 A1* | 6/2019 | Nomura | G01S 7/4873 |
| 2021/0134854 A1* | 5/2021 | Poikonen | H01L 27/1461 |

* cited by examiner

CIRCUIT DEVICE, PHYSICAL QUANTITY MEASURING DEVICE, ELECTRONIC APPARATUS, AND VEHICLE

BACKGROUND

1. Technical Field

The present invention relates to a circuit device, a physical quantity measuring device, an electronic apparatus, and a vehicle.

2. Related Art

A time-to-digital converter that converts a time to a digital value is known in the related art. For example, the time-to-digital converter has been used in a laser radar that measures a distance by using a method of time-of-flight (TOF). In the laser radar, laser is emitted at a given light emitting timing so as to irradiate a target with the emitted laser, a laser beam reflected from the target is received, and then a distance from the target is measured based on a time difference between a light emission signal indicating the light emitting timing and a light receiving signal indicating a light receiving timing.

Examples of such a laser radar in the related art includes a technology disclosed in JP-A-2010-286307. In the technology of the related art disclosed in JP-A-2010-286307, A/D conversion is performed on a signal level of the light receiving signal for the laser beam reflected from the target, in time series. Moving average processing or peak detection processing is performed on the signal level subjected to A/D conversion in time series, and the distance from the target is measured based on a result of the processing. In the technology of the related art, an A/D converter having a very fast sampling rate (2 GHz) is used for performing A/D conversion on the light receiving signal in time series.

Detecting a transition timing of a target signal with high accuracy is required for measuring time with high accuracy. For example, if time-digital conversion is performed with high performance (for example, high resolution or low measurement variation), a detection error of the transition timing may affect an error in time measurement.

In the above-described distance measurement, the distance can be measured with high accuracy by detecting the transition timing of a light receiving signal as the target signal with high accuracy. In the technology of the related art disclosed in JP-A-2010-286307, accuracy is improved by an A/D converter having a very fast sampling rate performing A/D conversion on a light receiving signal. However, the A/D converter having a very fast sampling rate is expensive, and thus the cost increases.

SUMMARY

An advantage of some aspects of the invention is to solve at least a part of the problems described above, and the invention can be implemented the following forms or embodiments.

An aspect of the invention relates to a circuit device including an analog front-end circuit that receives a target signal, and a processing circuit that performs arithmetic processing based on an output signal from the analog front-end circuit. The analog front-end circuit includes first to n-th comparator circuits that compare a voltage level of the target signal to first to n-th threshold voltages (n is an integer of 2 or greater) and output first to n-th comparison result signals. The processing circuit obtains a transition timing of the target signal based on the first to n-th comparison result signals and delayed-time information of the analog front-end circuit.

According to the aspect of the invention, the transition timing of the target signal can be obtained based on the comparison result signals obtained by comparison between the target signal and the first to n-th threshold voltages. Information of changes of the voltage level of the target signal with time can be obtained from the comparison result signals and it is possible to improve detection accuracy of the transition timing of the target signal. According to the aspect of the invention, it is possible to correct a delayed time of a signal in the analog front-end circuit by obtaining the transition timing of the target signal based on the delayed-time information of the analog front-end circuit. Thus, it is possible to further improve detection accuracy of the transition timing of the target signal. In this manner, it is possible to detect the transition timing of the target signal with high accuracy, for example, even though an A/D converter having a fast sampling rate is not provided.

In the aspect of the invention, the processing circuit may obtain time-voltage characteristic information based on the first to n-th comparison result signals and obtain the delayed-time information based on the time-voltage characteristic information. The time-voltage characteristic information indicates characteristics of voltage change of the target signal with time.

Since the waveform of the target signal varies depending on an acquisition condition of the target signal, the target signal input to the analog front-end circuit has various time-voltage characteristics. As described above, if the time-voltage characteristics of the target signal change, a delayed time of the signal in the analog front-end circuit may change. According to the aspect of the invention, the time-voltage characteristic information of the target signal can be obtained based on the first to n-th comparison result signals. Thus, it is possible to improve accuracy of correcting the delayed time when the transition timing of the target signal is obtained, by obtaining the delayed-time information based on the time-voltage characteristic information.

In the aspect of the invention, the analog front-end circuit may include a measurement circuit that measures a measurement voltage based on the voltage level of the target signal, at a transition timing of at least one of the first to n-th comparison result signals. The processing circuit may obtain the delayed-time information based on the measurement voltage.

A delay is provided between a timing at which the voltage level of the target signal exceeds the first to n-th threshold voltages and a timing at which each of the first to n-th comparison result signals transitions. Therefore, the voltage level of the target signal is different from the first to n-th threshold voltages at the timing at which the comparison result signal transitions. According to the aspect of the invention, information of the delay can be acquired by measuring the measurement voltage based on the voltage level of the target signal at a transition timing of at least one comparison result signal. The delayed-time information corresponding to the delayed time in the first to n-th comparator circuits can be obtained by obtaining the delayed-time information based on the measurement voltage.

In the aspect of the invention, the measurement circuit may include a sampling circuit that performs sampling on the voltage level of the target signal at a transition timing of an i-th comparison result signal (i is an integer of 1 to n), and an A/D conversion circuit to which the voltage level subjected to sampling by the sampling circuit and an i-th threshold voltage are input, and that performs A/D conversion on a differential voltage between the voltage level subjected to sampling by the sampling circuit and the i-th threshold voltage, as the measurement voltage.

According to this configuration, the voltage level of the target signal at the transition timing of an i-th comparison result signal is subjected to sampling, and the differential voltage between the voltage level subjected to sampling and the i-th threshold voltage is subjected to A/D conversion, as the measurement voltage. Thus, the measurement voltage can be measured based on the voltage level of the target signal at the transition timing of the comparison result signal of the comparator circuit.

In the aspect of the invention, the measurement circuit may include a selector that selects any of the first to n-th comparison result signals as the i-th comparison result signal.

According to this configuration, the voltage level of the target signal at the transition timing of at least one of the first to n-th comparison result signals can be subjected to sampling. Specifically, the voltage level of the target signal at the transition timing of the i-th comparison result signal can be subjected to sampling.

In the aspect of the invention, a j-th comparator circuit (j is an integer of 1 to n) may include a capacitor having one end to which a j-th threshold voltage is input in an initialization period and the target signal is input in a comparison period, and an amplifier circuit connected to the other end of the capacitor.

According to this configuration, it is possible to hold a potential difference using the j-th threshold voltage as a reference, in the capacitor by inputting the j-th threshold voltage to the one end of the capacitor in the initialization period. Since the target signal is input to the one end of the capacitor in the comparison period, the voltage at the other end of the capacitor can be changed with changing the voltage level of the target signal in a state where the potential difference between both the ends of the capacitor is held. The voltage at the other end of the capacitor is input to the amplifier circuit, and the comparison result signal can be output based on the output of the amplifier circuit.

In the aspect of the invention, the amplifier circuit may include an inverter and a switch that connects an output and an input of the inverter in the initialization period and does not connect the output and the input of the inverter in the comparison period.

According to this configuration, if the output and the input of the inverter are connected to each other in the initialization period, the voltage at the other end of the capacitor serves as the threshold voltage of the inverter. Thus, a difference between the j-th threshold voltage and the threshold voltage of the inverter is held as the potential difference between both the ends of the capacitor. If the output and the input of the inverter are not connected to each other in the comparison period, the inverter can output a logical level based on a difference between the voltage at the other end of the capacitor and the threshold voltage of the inverter. Thus, a timing at which the voltage level of the target signal exceeds the j-th threshold voltage can be detected and a detection result can be output as the comparison result signal.

In the aspect of the invention, the analog front-end circuit may include a first-signal comparator circuit that compares a first signal to a threshold voltage. The processing circuit may include first to n-th time-to-digital converters that convert a time difference in transition timing between an output signal from the first-signal comparator circuit and the first to n-th comparison result signals, to a digital value and output first to n-th time-digital conversion values, and an arithmetic circuit that obtains a time difference in transition timing between the first signal and a second signal as the target signal, based on the first to n-th time-digital conversion values and the delayed-time information.

According to this configuration, the time difference in transition timing between the first signal and the second signal in a case where a delay of the signal in the analog front-end circuit is not considered can be obtained based on the first to n-th time-digital conversion values. It is possible to correct the time difference in a case of not considering the delay, based on delayed-time information. The order of operations is not limited thereto. That is, it is not limited to a case where an operation for the time difference in a case of not considering the delay and an operation of correcting the time difference are performed as separate operations.

In the aspect of the invention, when a k-th time-digital conversion value is set as tk (k is an integer of 1 to n), an m-th time-digital conversion value is set as tm (m is an integer which is from 1 to n and is not equal to k), a k-th threshold voltage is set as Vthk, an m-th threshold voltage is set as Vthm, and the voltage level of the target signal at a transition timing of an m-th comparison result signal is set as Vsmp, the analog front-end circuit may include a measurement circuit that measures Vos; Vos=Vsmp−Vthm. The tc=Vos×(tm−tk)/(Vthm−Vthk). The arithmetic circuit may obtain t0 as the transition timing of the target signal; t0=(Vthm×tk−Vthk×tm)/(Vthm−Vthk)−tc.

According to this configuration, the inclination of changes of the voltage level of the target signal with time is obtained by (tm−tk)/(Vthm−Vthk) based on the k-th and m-th time-digital conversion values tk and tm. tc is obtained as the delayed-time information, based on the inclination and the measurement voltage Vos. The transition timing of the target signal in a case of not considering the delay in the analog front-end circuit is obtained by (Vthm×tk−Vthk×tm)/(Vthm−Vthk) based on the k-th and m-th time-digital conversion values tk and tm. The transition timing of the target signal in which the delay has been corrected can be obtained by subtracting tc from the transition timing.

Another aspect of the invention relates to a physical quantity measuring device including the circuit device described above.

Still another aspect of the invention relates to an electronic apparatus including the circuit device described above.

Still another aspect of the invention relates to a vehicle including the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferred embodiment of the invention will be described in detail. The embodiment which will be described below does not unduly limit the contents of the invention described in the appended claims, and all of the configurations described in the embodiment are not indispensable as means for solving the problem in the invention.

1. Physical Quantity Measuring Device and Circuit Device

Figure 1:
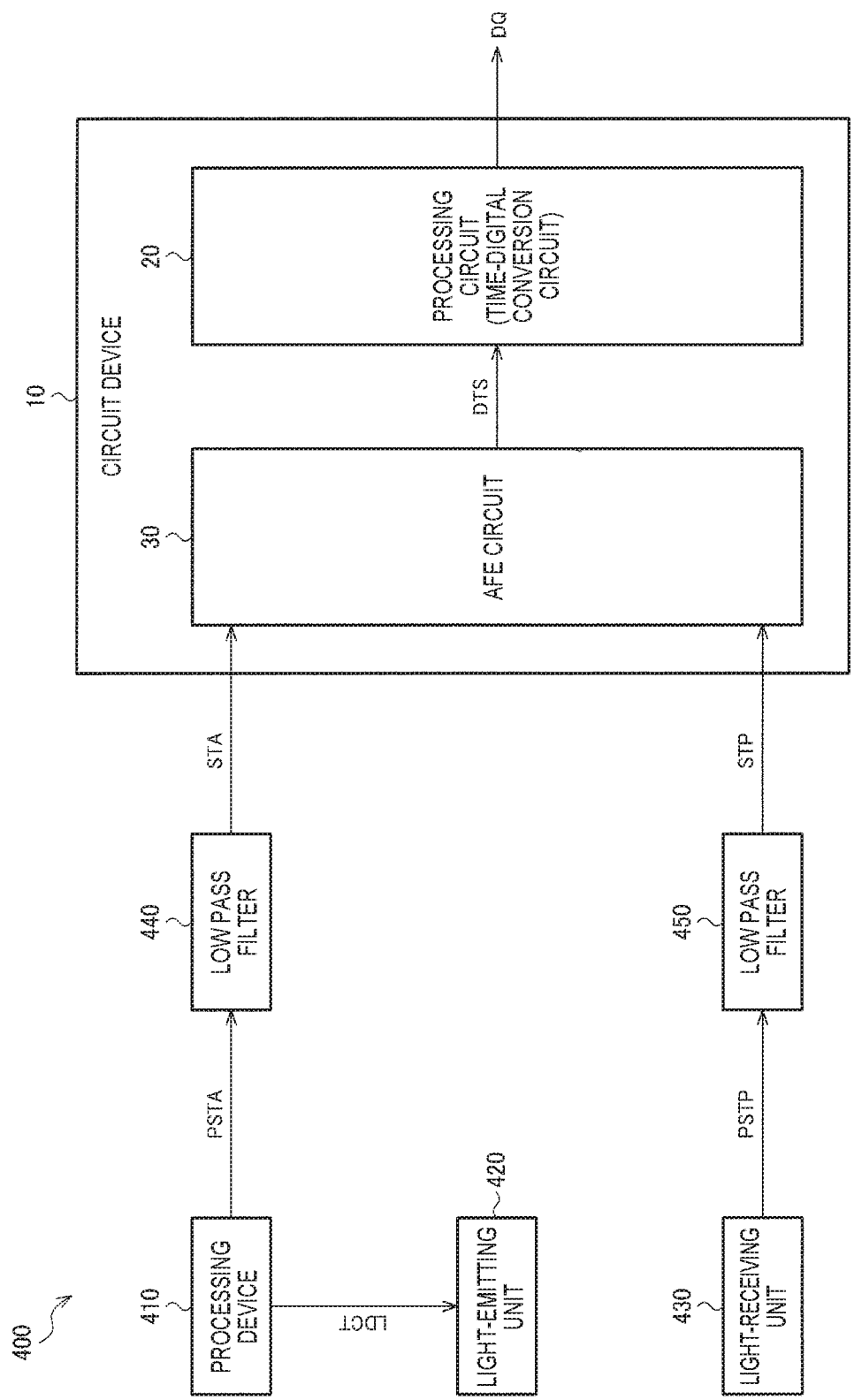
FIG. 1 illustrates a first configuration example of a circuit device and a physical quantity measuring device according to an embodiment.

FIG. 1 illustrates a first configuration example of a circuit device according to an embodiment and a physical quantity measuring device including the circuit device. A physical quantity measuring device 400 includes a circuit device 10, a processing device 410, a light-emitting unit (light source, light emitting device) 420, a light-receiving unit (light receiving sensor, light receiving device) 430, and low pass filters 440 and 450. The circuit device 10 includes an analog front-end circuit (AFE circuit) 30 and a processing circuit (time-to-digital converter) 20. The circuit device 10 is realized by, for example, an integrated circuit device (semiconductor circuit device). The configuration of the physical quantity measuring device and the circuit device is not limited to the configuration in FIG. 1. Various modifications as follows may be made. For example, some components thereof may be omitted, or other components may be added. For example, the physical quantity measuring device may be an ultrasonic measuring device that includes an ultrasonic probe instead of the light-emitting unit and the light-receiving unit. The physical quantity measured by the physical quantity measuring device is not limited to the time and the distance. Various kinds of physical quantities such as a flow quantity, a flow rate, a frequency, a velocity, acceleration, an angular velocity, and angular acceleration are considered.

The processing device 410 outputs a control signal LDCT for an instruction to emit light and a light-emitting pulse signal (light emission signal in a broad sense) PSTA indicating a light emitting timing. The pulse signal PSTA and the control signal LDCT may be the same as each other. The processing device 410 is, for example, a processor such as a micro-processing unit (MPU) or a central processing unit (CPU) or a control device such as an electronic control unit (ECU).

The light-emitting unit 420 receives the control signal LDCT and outputs a light pulse (light in a broad sense). The light-emitting unit 420 includes, for example, a light source and a driving circuit that drives the light source. The light source is, for example, a laser light source. The driving circuit may be included in the processing device 410. The light-receiving unit 430 photoelectrically converts a light pulse reflected from a measurement target and outputs a light-receiving pulse signal (light receiving signal in a broad sense) PSTP. The light-receiving unit 430 is, for example, a light receiving sensor such as a photodiode or a phototransistor.

The low pass filter 440 smooths the light-emitting pulse signal PSTA (reduces noise, performs low pass filter processing) and outputs the processed signal as a first signal (start signal) STA. The low pass filter 450 smooths the light-receiving pulse signal PSTP (reduces noise, performs low pass filter processing) and outputs the processed signal as a second signal (stop signal) STP. The low pass filters 440 and 450 are passive low pass filters configured by a capacitor and a resistor, for example. The low pass filters 440 and 450 may be mounted in the circuit device 10.

The AFE circuit 30 compares the voltage level of the first signal STA to a threshold voltage, and thus detects a timing at which the voltage level of the first signal STA exceeds the threshold voltage. The AFE circuit compares the voltage level of the second signal STP to a plurality of threshold voltages, and thus detects a timing at which the voltage level of the second signal STP exceeds each of the threshold voltages. The AFE circuit 30 outputs a comparison result signal as detection information DTS. The AFE circuit 30 outputs correction information for correcting a delayed time of a signal in the AFE circuit 30, as the detection information DTS. The delayed time corresponds to a time difference between an output timing of the comparison result signal in a case of assuming that a delay is not provided in the AFE circuit 30 and an output timing of the comparison result signal in practice. As will be described later, the correction information corresponds to A/D conversion data obtained by performing A/D conversion on a voltage value of the second signal STP at a given timing.

The processing circuit 20 obtains a digital value DQ based on the detection information DTS and outputs the digital value DQ. The digital value DQ indicates a time difference in transition timing between the first signal STA and the second signal STP. Specifically, the processing circuit obtains the digital value DQ in a manner that the processing circuit corrects the time difference of the transition timing, which is obtained based on the comparison result signal, by using delayed-time information obtained based on A/D conversion data. The delayed-time information is information indicating the delayed time of a signal in the AFE circuit 30.

In the above descriptions, an example in which the delayed-time information is obtained based on the A/D conversion data obtained by performing A/D conversion on the voltage value of the second signal STP at the given timing is described. However, the delayed-time information is not limited thereto. For example, the delayed-time information may be input to the processing circuit 20. For example, the circuit device 10 may include a memory, a register, or the like that stores the delayed-time information and the processing circuit 20 may read the delayed-time information from the memory, the register, or the like.

Figure 2:
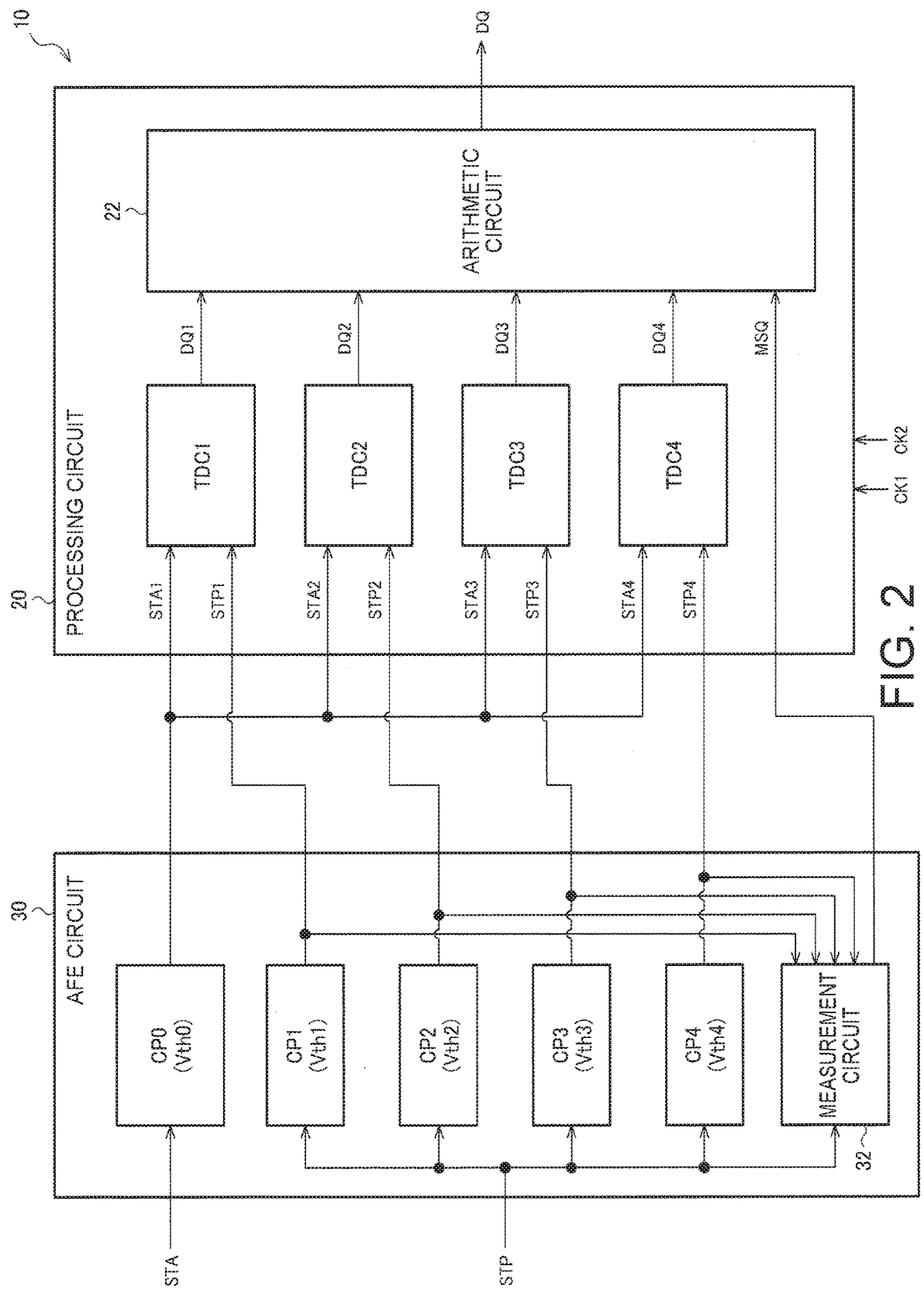
FIG. 2 illustrates a detailed configuration example of an AFE circuit and a processing circuit.

FIG. 2 illustrates a detailed configuration example of the AFE circuit and the processing circuit. The AFE circuit 30 includes first to fourth comparator circuits (first to n-th comparator circuits) CP1 to CP4 that compare the voltage level of the second signal (stop signal) STP to first to fourth threshold voltages (first to n-th threshold voltages) Vth1 to Vth4 and output first to fourth stop signals (first to n-th stop signals, first to n-th comparison result signals) STP1 to STP4. The stop signals STP1 to STP4 are stop signals subjected to waveform shaping. The AFE circuit 30 includes a comparator circuit CP0 that outputs first to fourth start signals (first to n-th start signals, comparison result signal) STA1 to STA4 based on the first signal (start signal) STA. The start signals STA1 to STA4 are start signals subjected to waveform shaping. The AFE circuit 30 includes a measurement circuit 32 that measures the voltage level of the second signal STP at a transition timing of at least one of the stop signals STP1 to STP4 and outputs information MSQ of the measurement voltage.

The comparator circuit CP0 includes a comparator and first to fourth buffering circuits. The comparator compares the voltage level of the signal STA to a threshold voltage Vth0. The first to fourth buffering circuits buffer an output signal of the comparator and output the start signals STA1 to STA4. The comparator circuit CP1 includes a comparator and a buffering circuit. The comparator compares the voltage level of the signal STP to the threshold voltage Vth1. The buffering circuit buffers the output signal of this comparator and outputs the stop signal STP1. Similarly, the comparator circuits CP2, CP3, and CP4 include comparators that compare the voltage level of the signal STP to the threshold voltages Vth2, Vth3, and Vth4 and buffering circuits that buffer output signals of the comparators and output the stop signals STP2, STP3, and STP4, respectively. The measurement circuit 32 includes a sampling circuit and an A/D conversion circuit. The sampling circuit performs sampling on the voltage level of the second signal STP at the transition timing of at least one of the stop signals STP1 to STP4. The A/D conversion circuit performs A/D conversion on the voltage level subjected to sampling. Data of the voltage level subjected to A/D conversion is output as the information MSQ of the measurement voltage.

The processing circuit 20 includes first to fourth time-to-digital converters (first to n-th time-to-digital converters) TDC1 to TDC4 that output first to fourth time-digital conversion values (first to n-th time-digital conversion values) DQ1 to DQ4. The processing circuit 20 includes an arithmetic circuit 22 that calculates the digital value DQ indicating the time difference in transition timing between the first signal STA and the second signal STP, based on the time-digital conversion values DQ1 to DQ4 and the information MSQ of the measurement voltage.

The time-to-digital converter TDC1 performs processing of converting the time difference in transition timing between the start signal STA1 and the stop signal STP1 to a digital value, and thus outputs the time-digital conversion value DQ1. Similarly, the time-to-digital converters TDC2, TDC3, and TDC4 perform processing of converting the time difference between transition timings of the start signals STA2, STA3, and STA4 and transition timings of the stop signals STP2, STP3, and STP4 to digital values, and thus output time-digital conversion values DQ2, DQ3, and DQ4, respectively.

The arithmetic circuit 22 performs arithmetic processing based on the time-digital conversion values DQ1 to DQ4 and the information MSQ of the measurement voltage, and thus obtains the digital value DQ corresponding to the time difference in transition timing between the signal STA and the signal STP. Specifically, the arithmetic circuit obtains a transition timing before correction, based on at least two time-digital conversion values of the time-digital conversion values DQ1 to DQ4 and obtains a correction value (delayed-time information) based on at least two time-digital conversion values and the information MSQ of the measurement voltage. The arithmetic circuit obtains the digital value DQ by subtracting the correction value from the transition timing. It is not limited to a case where the transition timing before the correction and the correction value are separately calculated. The digital value DQ may be calculated based on the at least two time-digital conversion values and the information MSQ of the measurement voltage by using a given arithmetic expression. The arithmetic circuit 22 is configured by a logic circuit that performs calculation of a digital signal. For example, the arithmetic circuit 22 is a digital signal processor (DSP) that performs processing of calculating the digital value DQ by time division processing or a logic circuit in which calculation of the digital value DQ is realized by hardware.

The threshold voltages Vth1 to Vth4 of the comparator circuits CP1 to CP4 are different from each other. For example, a relationship of Vth1<Vth2<Vth3<Vth4 is established. Thus, inclination information of the signal STP can be obtained. Thus, the arithmetic circuit 22 may specify an accurate transition timing of the signal STP by inclination information of the signal STP and obtain the digital value DQ corresponding to the time difference in transition timing between the signals STA and STP. Since the arithmetic circuit 22 obtains the correction value (delayed-time information) and corrects the transition timing by using the correction value so as to obtain the digital value DQ, it is possible to correct the delayed time of the signal in the AFE circuit 30 and to improve accuracy of time measurement. Details of the arithmetic processing will be described later with reference to FIGS. 3 and 4.

In the above descriptions, an example in which the comparator circuit CP0 outputs the start signals STA1 to STA4 to the time-to-digital converters TDC1 to TDC4 is described. However, it is not limited thereto. For example, the comparator circuit CP0 may include a comparator and one buffer circuit, and the buffer circuit may perform buffering of an output signal of the comparator and output the start signal to the time-to-digital converters TDC1 to TDC4. In the above descriptions, an example in which the signal STA is input from the outside of the circuit device 10 is described. However, it is not limited thereto. For example, the circuit device 10 may spontaneously generate the signal STA. In a case of the spontaneous type, the start signals STA1 to STA4 are not input from the AFE circuit 30 but are generated in the processing circuit 20. In this case, the comparator circuit CP0 may be omitted. The time-to-digital converters TDC1 to TDC4 convert a time difference in transition timing between the start signals STA1 to STA4 which have been spontaneously generated, and the stop signals STP1 to STP4 from the comparator circuits CP1 to CP4, to a digital value.

2. Arithmetic Processing of Digital Value of Time Difference

Figure 3:
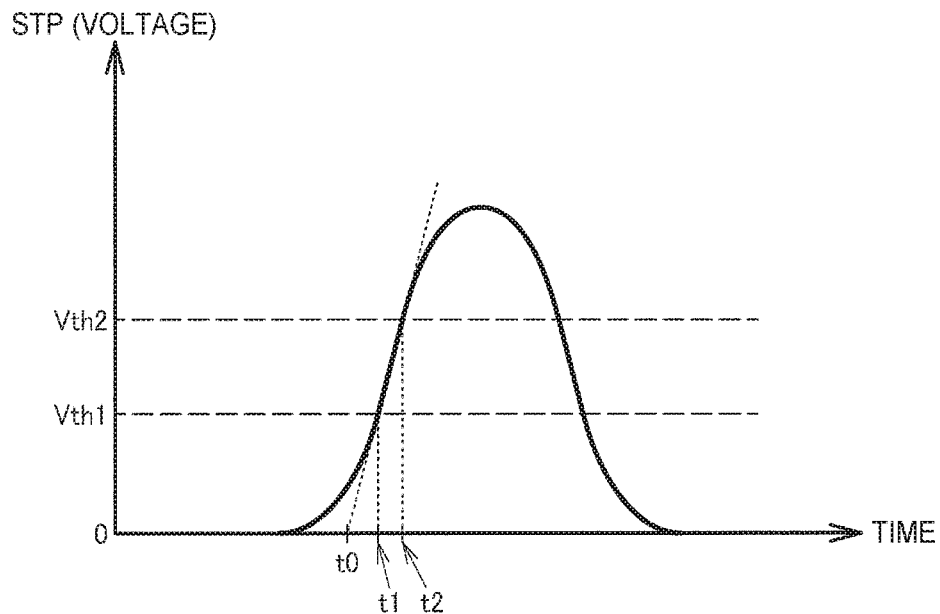
FIG. 3 is a diagram illustrating arithmetic processing of a digital value of a time difference in the embodiment.
Figure 4:
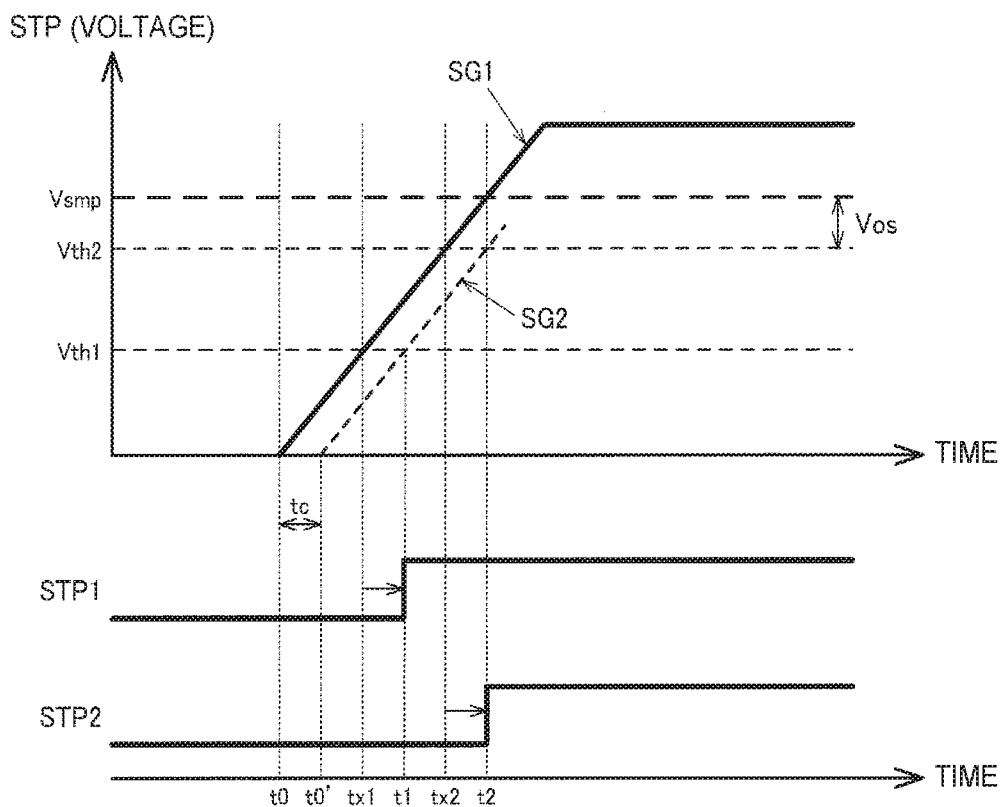
FIG. 4 is a diagram illustrating the arithmetic processing of the digital value of the time difference in the embodiment.

FIGS. 3 and 4 are diagrams illustrating the arithmetic processing of the digital value of the time difference in the embodiment. In the following descriptions, an example using the threshold voltages Vth1 and Vth2 will be described. However, it is not limited thereto and two of the threshold voltages Vth1 to Vth4 may be used.

As illustrated in FIG. 3, the signal STP input to the AFE circuit 30 is a pulse waveform (includes a pulse waveform). The waveform is a waveform which gently changes (blunted waveform) by various factors, for example, as follows: a situation of a transmission path of light; characteristics of a target which reflects light; characteristics of the light-receiving unit; and transmission characteristics of a transmission path (for example, low pass filter) of the light receiving signal. In the embodiment, the comparator circuits CP1 and CP2 detect timings t1 and t2 at which the voltage level of the signal STP has exceeded the threshold voltages Vth1 and Vth2, respectively. The processing circuit 20 obtains a straight line which is approximate to the waveform of the signal STP, extrapolates the straight line to obtain a zero-cross point of the straight line (a point at which the voltage level of STP becomes zero), and obtains the zero-cross point as a transition timing t0. As described with reference to FIG. 4, the timings t1 and t2 which are detected in practice are delayed from an ideal timing. Thus, when the transition timing t0 is obtained, correction is performed based on the information MSQ of the measurement voltage from the measurement circuit 32.

SG1 in FIG. 4 schematically (linearly) indicates a voltage waveform of the signal STP input to the AFE circuit 30. SG2 indicates a voltage waveform of the signal STP which is virtually delayed by the delayed time of the signal in the AFE circuit 30.

The comparator circuits CP1 and CP2 output stop signals STP1 and STP2 having a low level (first logical level) in a case where the voltage level of the signal STP is smaller than the threshold voltages Vth1 and Vth2. The comparator circuits CP1 and CP2 output stop signals STP1 and STP2 having a high level (second logical level) in a case where the voltage level of the signal STP is larger than the threshold voltages Vth1 and Vth2. In an ideal case of assuming that the signal in the AFE circuit 30 does not have a delay, the stop signals STP1 and STP2 change from the low level to the high level at timings tx1 and tx2. In practice, the timing is delayed by the delayed time of the signal in the AFE circuit 30. Thus, the stop signals STP1 and STP2 change from the low level to the high level at the timings t1 and t2 (t1>tx1, t2>tx2).

In order to correct the delayed time, the measurement circuit 32 performs sampling on the voltage level of the signal STP at the timing t2. A voltage obtained by the sampling is set as Vsmp. The measurement circuit 32 performs A/D conversion on the measurement voltage Vos which is a differential voltage between the voltage Vsmp and the threshold voltage Vth2 and outputs A/D conversion data obtained by A/D conversion, as the information MSQ of the measurement voltage. The processing circuit 20 obtains the transition timing t0 of the signal STP by Expressions (1) to (3), based on the timings t1 and t2 detected by the comparator circuits CP1 and CP2 and the measurement voltage Vos measured by the measurement circuit 32. t0' indicates a transition timing in an ideal case of assuming that the signal in the AFE circuit 30 does not have a delay. tc indicates a correction value for correcting the transition timing and corresponds to the delayed time of the signal in the AFE circuit 30.

$$t0 = t0' - tc \quad (1)$$

$$t0' = \frac{Vth2 \times t1 - Vth1 \times t2}{Vth2 - Vth1} \quad (2)$$

$$tc = \frac{Vos}{Vth2 - Vth1} \times (t2 - t1) \quad (3)$$

The correction value tc is a value obtained by dividing the measurement voltage Vos measured by the measurement circuit 32, by an inclination of the straight line obtained based on the threshold voltages Vth1 and Vth2 and the timings t1 and t2. Since the transition timing is corrected by such a correction value tc, time-digital conversion with high accuracy, in which the delay of the signal in the AFE circuit 30 has been corrected can be realized.

Regarding Expressions (1) to (3), the order of the operations is not limited. That is, t0' and tc may be calculated by Expressions (2) and (3) and then t0 may be obtained by Expression (1). t0 may be obtained by calculation based on an expression obtained by substituting Expressions (2) and (3) with Expression (1).

In FIGS. 3 and 4, the transition timing t0 of the signal STP is obtained by using the transition timings of the signals STP1 and STP2. In the embodiment, the time difference in transition timing between the signal STA and the signal STP is obtained based on the time difference in transition timing between the signals STA1 and STA2 and the signals STP1 and STP2. That is, the timing t1 is measured as the time difference in transition timing between the signal STA1 and the signal STP1. The timing t2 is measured as the time difference in transition timing between the signal STA2 and the signal STP2. The transition timing t0 is calculated as the time difference in transition timing between the signal STA and the signal STP.

According to the above embodiment, the circuit device 10 includes the analog front-end circuit (AFE circuit) 30 to which the target signal (STP) is input, and the processing circuit 20 that performs arithmetic processing based on the output signal (DTS) from the AFE circuit 30. The AFE circuit 30 includes the comparator circuits CP1 to CP4 (first to n-th comparator circuits) that compare the voltage level of the target signal to the threshold voltages (first to n-th threshold voltages (n is an integer of 2 or greater)) Vth1 to Vth4 and output the comparison result signals (STP1 to STP4, first to n-th comparison result signals). The processing circuit 20 obtains the transition timing (t0) of the target signal based on the comparison result signals (STP1 to STP4) and the delayed-time information of the AFE circuit 30.

According to this configuration, the transition timing of the target signal can be obtained based on the comparison result signals obtained by comparison between the target signal and the threshold voltages Vth1 to Vth4. Since the timings at which the voltage level of the target signal becomes the threshold voltages Vth1 to Vth4 can be known from the comparison result signal, it is possible to obtain information of changes of the voltage level of the target signal with time, based on the information. It is possible to accurately estimate the transition timing of the target signal based on the information of changes with time. For example, in Expressions (1) to (3), the transition timing of the target signal can be estimated based on the zero-cross point of a straight line in a manner that the changes of the voltage level of the target signal with time are made to be approximate to the straight line based on the comparison result signals.

Figure 5:
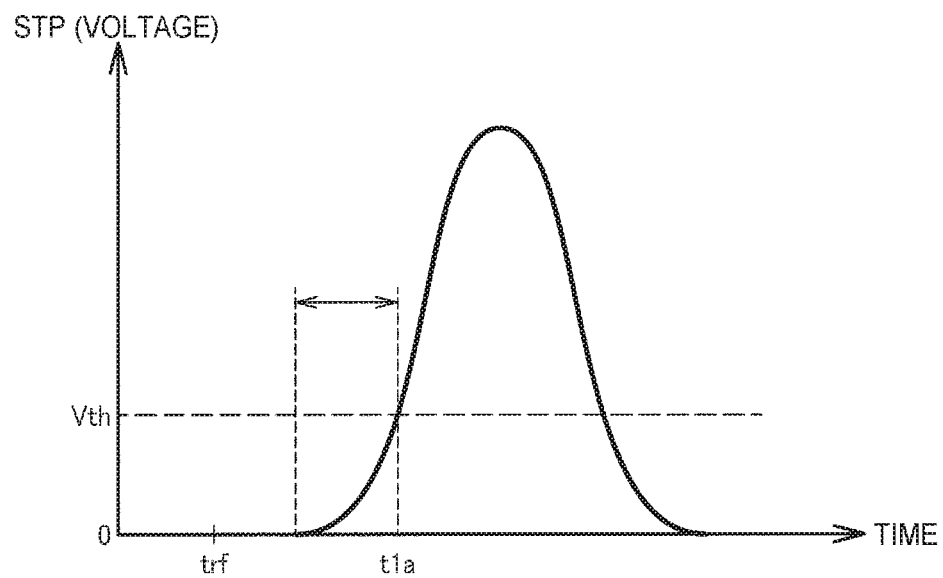
FIG. 5 is a diagram in a case of detecting a transition timing of a target signal by using one threshold voltage.
Figure 6:
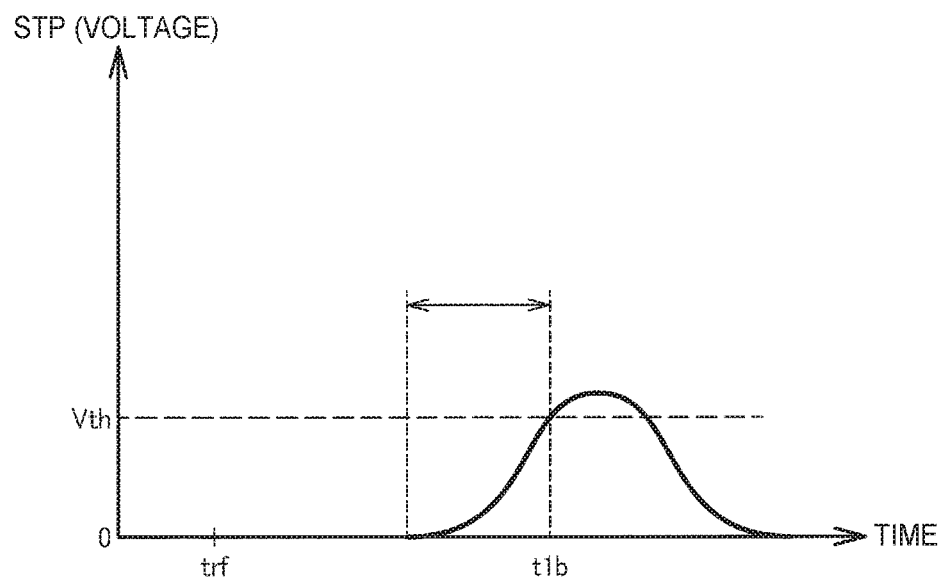
FIG. 6 is a diagram in a case of detecting the transition timing of the target signal by using one threshold voltage.

For example, as illustrated in FIGS. 5 and 6, it is assumed that the transition timing of the target signal (STP) is detected by using one threshold voltage Vth. trf in FIGS. 5 and 6 indicates a reference timing (for example, transition timing of the signal STA). In FIGS. 5 and 6, timings t1a and t1b at which the voltage level of the target signal becomes the threshold voltage Vth are detected as transition timings of the target signal. At this time, as illustrated in FIG. 5, in a case where the wave height of the target signal is high (for example, a case where the distance from a target in a physical quantity measuring device in FIG. 1 is short), the value of the signal reaches the threshold voltage Vth while the waveform rises. As illustrated in FIG. 6, in a case where the wave height of the target signal is low (for example, a case where the distance from a target in the physical quantity measuring device in FIG. 1 is long), the value of the signal reaches the threshold voltage Vth at a position close to the peak of the waveform. Therefore, t1a and t1b detected as the transition timings include an error depending on the waveform of the target signal (for example, wave height, inclination of changes with time, and the like). For example, if a timing at which the voltage level of the target signal starts to rise from zero is set as a reference, a time from the reference to t1a or t1b varies depending on the waveform of the target signal. At this point, according to the embodiment, for example, the waveform of the target signal is allowed to be approximate to a straight line by comparing the voltage level of the target signal to the plurality of threshold voltages. Thus, it is possible to reduce a detection error of the transition timing of the target signal.

According to the embodiment, it is possible to detect the transition timing of the target signal with improved accuracy, by obtaining the transition timing of the target signal based on the delayed-time information of the AFE circuit 30. That is, the delayed time of the target signal in the AFE circuit 30 can be corrected based on the delayed-time information, and thus it is possible to reduce the detection error of the transition timing of the target signal. For example, in Expressions (1) to (3), the correction value tc corresponds to the delayed-time information, and the transition timing is corrected by the delayed-time information. For example, in a case where the delayed time is equal to or greater than the degree of (variation of) resolution or accuracy of time-digital conversion, the delayed time may largely affect performance of time-digital conversion. In the embodiment, it is possible to realize time-digital conversion with high performance (physical quantity measurement with high performance) by correcting the delayed time.

As described above, in the embodiment, the transition timing of the target signal can be detected with high accuracy, based on the comparison result signals of the comparator circuits CP1 to CP4 and the delayed-time information of the AFE circuit 30. Therefore, it is possible to reduce cost of the physical quantity measuring device. For example, in the technology of the related art disclosed in JP-A-2010-286307, an A/D converter which has a high sampling rate and is used for measuring the waveform of a light receiving signal is used. However, in the embodiment, even though such an A/D converter having a high sampling rate is not provided, it is possible to detect the transition timing of the target signal with high accuracy.

In the embodiment, the processing circuit 20 obtains time-voltage characteristic information indicating characteristics of the voltage of the target signal (STP) with time, based on the comparison result signals (STP1 to STP4), and obtains the delayed-time information based on the time-voltage characteristic information.

Since the waveform of the target signal varies depending on an acquisition condition of the target signal (a measurement condition of a physical quantity), the target signal input to the AFE circuit 30 has various time-voltage characteristics. For example, as illustrated in FIGS. 5 and 6, if the wave height of the target signal changes, the inclination of changes of the voltage level of the target signal with time changes. In the distance measuring device as in FIG. 1, the waveform of the target signal changes in accordance with measurement conditions such as a situation of a transmission path of light, characteristics of a target which reflects light, and characteristics of the light-receiving unit. As described above, if the time-voltage characteristics of the target signal change, the delayed time of the target signal in the AFE circuit 30 may change. For example, as the inclination of changes of the voltage level of the target signal with time becomes smaller, reaction times of the comparator circuits (comparators) CP1 to CP4 tend to increase. At this point, according to the embodiment, it is possible to obtain time-voltage characteristic information of the target signal based on the comparison result signals of the comparator circuits CP1 to CP4. Thus, it is possible to improve accuracy of correcting the delayed time when the transition timing of the target signal is obtained, by obtaining the delayed-time information based on the time-voltage characteristic information.

In FIG. 4 and Expressions (1) to (3), the inclination of changes of the voltage level of the target signal with time corresponds to the time-voltage characteristic information. However, the time-voltage characteristic information is not limited thereto. For example, changes of the voltage level of the target signal may be made to be approximate (fit) to a curve by using transition timings of three comparison result signals or more of the comparison result signals (STP1 to STP4), and information of the curve may be used as the time-voltage characteristic information. Thus, the transition timing of the target signal may be obtained based on the curve and the measurement voltage Vos.

In the embodiment, the AFE circuit 30 includes the measurement circuit 32 that measures the measurement voltage Vos based on the voltage level of the target signal (STP) at the transition timing of the comparison result signal (at least one of STP1 to STP4) of at least one comparator circuit of the comparator circuits CP1 to CP4. The processing circuit 20 obtains the delayed-time information based on the measurement voltage Vos.

As illustrated in FIG. 4, a delay is provided between timings at which the voltage level of the target signal exceeds the threshold voltages Vth1 to Vth4 and timings at which comparison result signals of the comparator circuits CP1 to CP4 transition. Therefore, the voltage level of the target signal is different from the threshold voltages Vth1 to Vth4 at the timing at which the comparison result signal transitions. In the embodiment, the information of the delay can be acquired by measuring the measurement voltage Vos based on the voltage level of the target signal (STP) at the transition timing of the comparison result signal of at least one comparator circuit. The delayed-time information corresponding to the practical delayed time in the comparator circuits CP1 to CP4 can be obtained by obtaining the delayed-time information based on the measurement voltage Vos. As described above, the delayed time in the AFE circuit 30 varies depending on an acquisition condition of the target signal (a measurement condition of a physical quantity). According to the embodiment, it is possible to acquire accurate delayed-time information even though such a delayed time fluctuates.

In FIG. 4, the measurement voltage Vos is a differential voltage between the voltage level (Vsmp) of the target signal (STP) at the transition timing of the comparison result signal (STP2), and the threshold voltage Vth2. The measurement voltage is not limited thereto. The measurement voltage may be a voltage corresponding to the voltage level of the target signal at the transition timing of the comparison result signal. For example, the measurement voltage may be the voltage level itself of the target signal at the transition timing of the comparison result signal. In this case, for example, data corresponding to Vos in FIG. 4 may be acquired in a manner that the A/D conversion circuit performs A/D conversion on the voltage level of the target signal at the transition timing of the comparison result signal, and the arithmetic circuit 22 subtracts data indicating the threshold voltage Vth2 from A/D conversion data.

In FIG. 4 and Expressions (1) to (3), the measurement voltage is measured based on the comparison result signal of one comparator circuit. However, it is not limited thereto. The measurement voltage may be measured based on comparison result signals of a plurality of comparator circuits. That is, the measurement voltage may be measured based on the voltage level of the target signal at the transition timing of each of a plurality of comparison result signals. In this case, the measurement voltage corresponding to the transition timing of each of the plurality of comparison result signals can be obtained, and the transition timing of the target signal can be obtained based on (one or a plurality of measurement voltages of) the plurality of measurement voltages.

In the embodiment, the AFE circuit 30 includes the comparator circuit (first-signal comparator circuit) CP0 that compares the first signal STA to the threshold voltage Vth0. The processing circuit 20 includes the time-to-digital converters (first to n-th time-to-digital converters) TDC1 to TDC4 and the arithmetic circuit 22. The time-to-digital converters TDC1 to TDC4 convert the time difference in transition timing between output signals (STA1 to STA4, comparison result signals) from the comparator circuit CP0 and comparison result signals (STP1 to STP4) from the comparator circuits CP1 to CP4, to digital values. Then, the time-to-digital converters output the time-digital conversion values (first to n-th time-digital conversion values) DQ1 to DQ4. The arithmetic circuit 22 obtains the time difference in transition timing between the first signal STA and the second signal STP as the target signal, based on the time-digital conversion values DQ1 to DQ4 and the delayed-time information.

According to this configuration, the time difference in transition timing between the signal STA and the signal STP in a case of not considering a delay can be obtained based on the time-digital conversion values DQ1 to DQ4. It is possible to correct the time difference in a case of not considering the delay, based on the delayed-time information. For example, in Expressions (1) to (3), t0' corresponds to the time difference in a case of not considering a delay, and tc corresponds to the delayed-time information. The time difference in transition timing between the signal STA and the signal STP is obtained by performing correction by subtracting tc from t0'.

In the embodiment, the k-th time-digital conversion value of the time-digital conversion values (first to n-th time-digital conversion values) DQ1 to DQ4 is set as tk (k is an integer of 1 to n). The m-th time-digital conversion value thereof is set as tm (m is an integer which is from 1 to n and is not equal to k). In the embodiment, n is 4. However, n is not limited to 4. The k-th threshold voltage of the threshold voltages (first to n-th threshold voltages) Vth1 to Vth4 is set as Vthk and the m-th threshold voltage thereof is set as Vthm. The voltage level of the target signal (STP) at a transition timing of a comparison result signal (STPm) of the m-th comparator circuit among the comparator circuits (first to n-th comparator circuits) CP1 to CP4 is set as Vsmp. At this time, the AFE circuit 30 includes the measurement circuit 32 that measures Vos; Vos=Vsmp−Vthm. The delayed-time information indicates that tc=Vos×(tm−tk)/(Vthm−Vthk). The arithmetic circuit 22 obtains t0 as the transition timing of the target signal; t0=(Vthm×tk−Vthk×tm)/(Vthm−Vthk)−tc. In Expressions (1) to (3), a case where k is 1 and m is 2 is described. However, it is not limited thereto.

According to this configuration, the inclination of changes of the voltage level of the target signal with time is obtained by (tm−tk)/(Vthm−Vthk) based on time-digital conversion values tk and tm. tc is obtained as the delayed-time information, based on the inclination and the measurement voltage Vos. The transition timing of the target signal in a case of not considering the delay in the AFE circuit 30 is obtained by (Vthm×tk−Vthk×tm)/(Vthm−Vthk) based on the time-digital conversion values tk and tm. The transition timing of the target signal in which the delay has been corrected can be obtained by subtracting tc from the transition timing.

3. AFE Circuit

Figure 7:
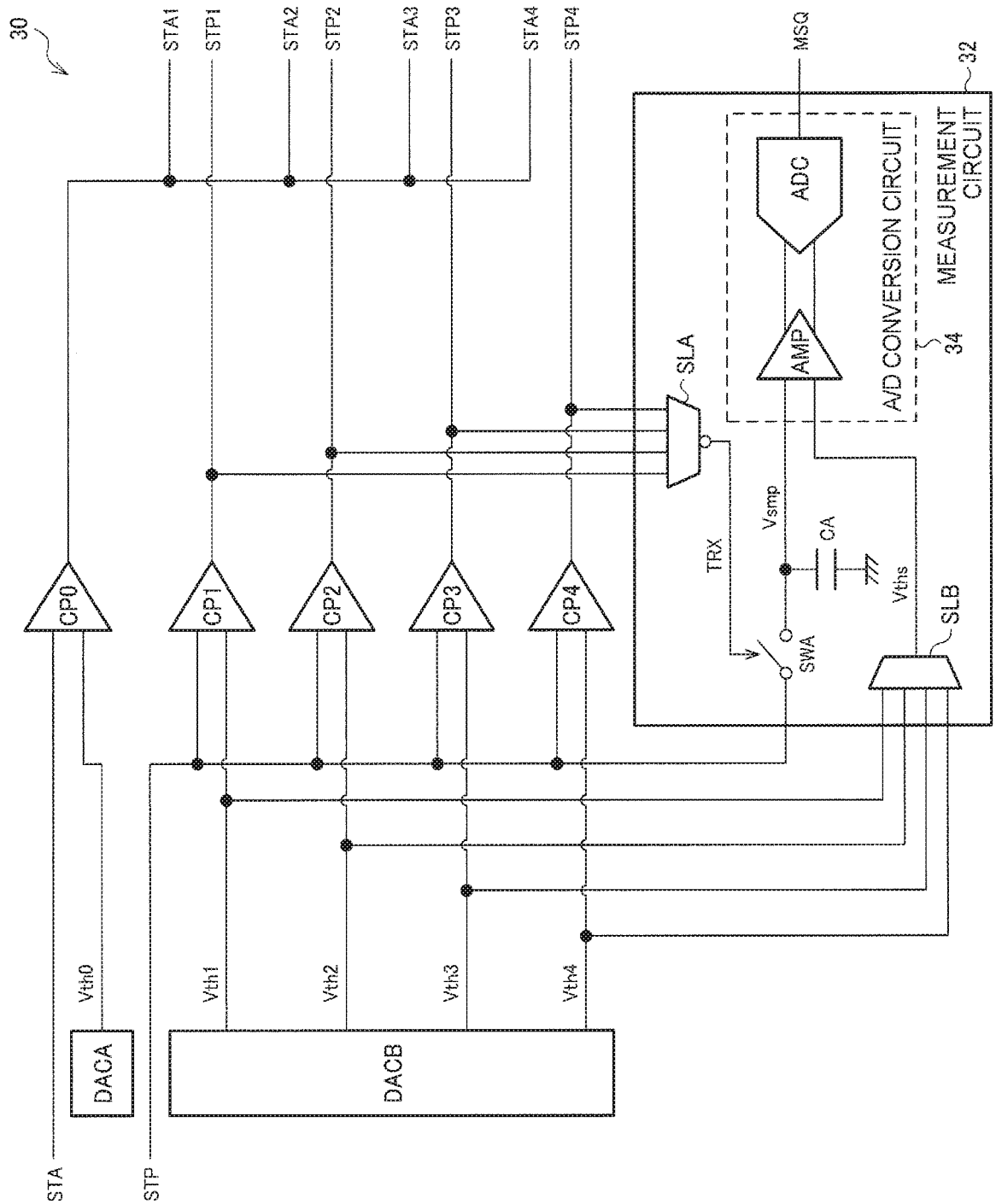
FIG. 7 illustrates a second detailed configuration example of the AFE circuit.

FIG. 7 illustrates a second detailed configuration example of the AFE circuit. The AFE circuit 30 includes the comparator circuit CP0, the first to fourth comparator circuits CP1 to CP4, D/A conversion circuits DACA and DACB (voltage output circuit in a broad sense), and the measurement circuit 32. The components which are already described above are denoted by the same reference signs and descriptions of the components will be appropriately omitted.

The D/A conversion circuit DACA outputs the threshold voltage Vth0 corresponding to setting information, based on the setting information set in a register (not illustrated), for example. That is, the D/A conversion circuit DACA performs D/A conversion on a code value corresponding to the setting information, into the threshold voltage Vth0. The D/A conversion circuit DACB outputs the threshold voltages Vth1 to Vth4 corresponding to setting information, based on the setting information set in a register (not illustrated), for example. That is, the D/A conversion circuit DACB performs D/A conversion on first to fourth code values corresponding to the setting information, into the threshold voltages Vth1 to Vth4. For example, each of the D/A conversion circuits DACA and DACB includes a ladder resistor and a switch. The ladder resistor is connected between a node of a first voltage and a node of a second voltage. The switch selects any of a plurality of voltages divided by the ladder resistor and outputs the selected voltage as the threshold voltage.

The D/A conversion circuits DACA and DACB may be configured as an integrated D/A conversion circuit. The threshold voltages Vth0 and Vth1 to Vth4 may be fixed voltages. In this case, the AFE circuit 30 may not include the D/A conversion circuits DACA and DACB but include a voltage output circuit that outputs the threshold voltage Vth0 and a voltage output circuit that outputs the threshold voltages Vth1 to Vth4.

The measurement circuit 32 includes a selector (digital selector, logic selector) SLA, a selector (analog selector)

SLB, a switching element (switch) SWA, a capacitor CA, and an A/D conversion circuit 34.

The stop signals STP1 to STP4 are input to the selector SLA. The selector SLA selects any of the stop signals STP1 to STP4. The selector SLA outputs a logic inversion signal of the selected signal as a trigger signal (sampling control signal) TRX. The selector SLA is configured by a logic circuit, for example.

ON and OFF of the switching element SWA is controlled by the trigger signal TRX. Specifically, the switching element SWA turns ON when the trigger signal TRX has a high level (second logical level) and turns OFF when the trigger signal TRX has a low level (first logical level). The switching element SWA is an analog switch and is configured by a transistor, for example.

The capacitor CA is used for performing sampling on the voltage level of the signal STP in a period in which the trigger signal TRX has a high level. The capacitor CA holds the voltage level of the signal STP when the trigger signal TRX turns from the high level to the low level.

The threshold voltages Vth1 to Vth4 are input to the selector SLB. The selector SLB selects any of the threshold voltages Vth1 to Vth4 and outputs the selected threshold voltage as a voltage Vths. Specifically, when the selector SLA selects the stop signal STP1, the selector SLB selects the threshold voltage Vth1. Similarly, when the selector SLA selects the stop signal STP2, STP3, or STP4, the selector SLB selects the threshold voltage Vth2, Vth3, or Vth4, respectively. For example, the selector SLB is configured by an analog switch which is configured by a transistor.

A differential voltage configured by the voltage Vsmp which has been subjected to sampling and held by the capacitor CA and the voltage Vths selected by the selector SLB is input to the A/D conversion circuit 34. The A/D conversion circuit 34 performs A/D conversion on the differential voltage and outputs A/D conversion data thereof, as information MSQ of the measurement voltage.

The A/D conversion circuit 34 includes an amplifier circuit (differential amplifier circuit) AMP and an A/D converter ADC. The differential voltage configured by the voltage Vsmp and the voltage Vths is input to the amplifier circuit AMP. The amplifier circuit AMP differentially amplifies the differential voltage and outputs the differential voltage after the amplification, to the A/D converter ADC. The amplifier circuit AMP is a programmable gain amplifier having a gain which can be variably set, for example. Alternatively, the amplifier circuit AMP may be an amplifier circuit having a fixed gain. The A/D converter ADC performs A/D conversion on the differential voltage from the amplifier circuit AMP and outputs A/D conversion data thereof, as information MSQ of the measurement voltage. As the type of the A/D converter ADC, for example, a successive approximation type, a flash type, a pipeline type, and a double integrating type can be employed.

Figure 8:
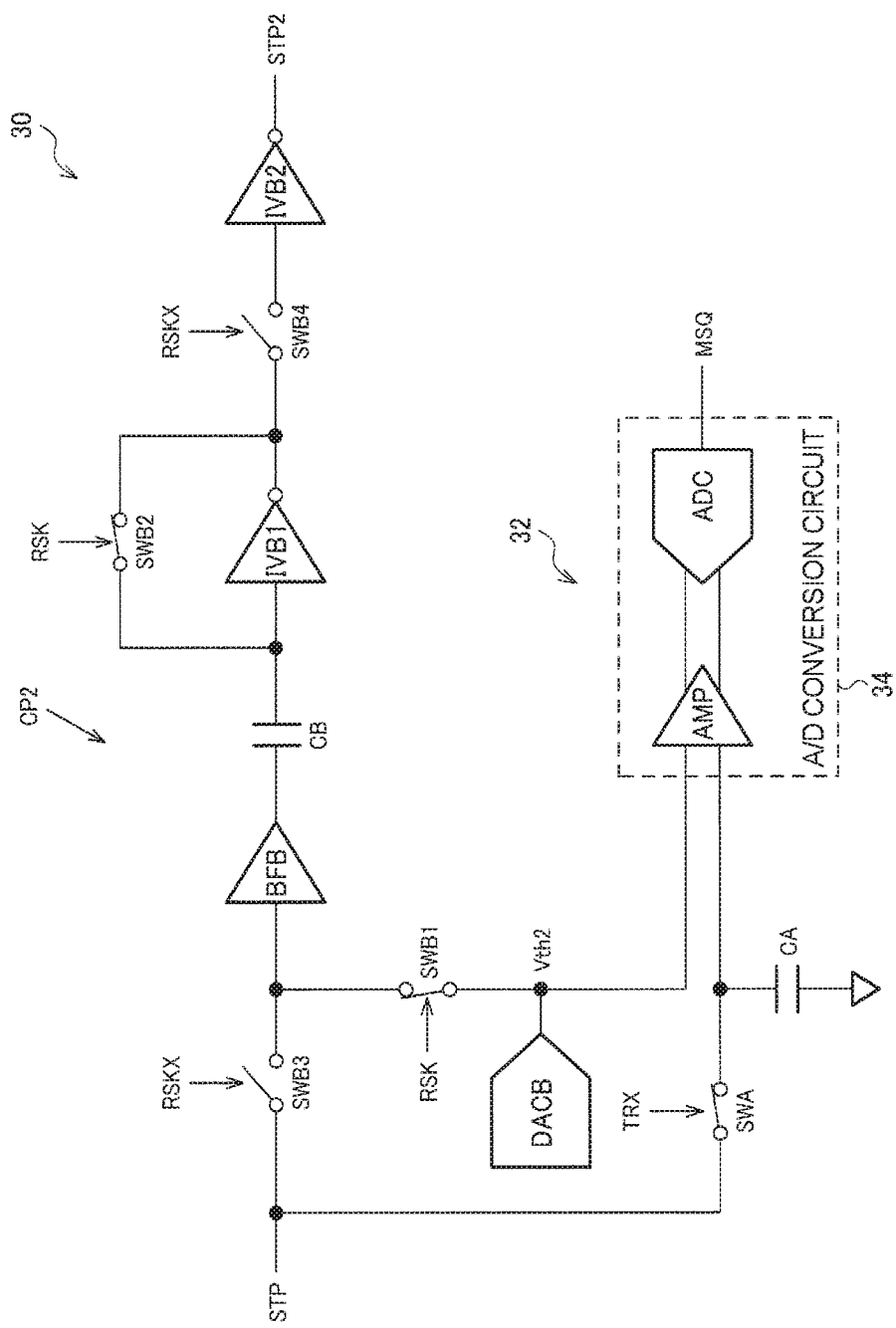
FIG. 8 illustrates a detailed configuration example of a comparator circuit.

FIG. 8 illustrates a detailed configuration example of the comparator circuit. In the following descriptions, the comparator circuit CP2 will be described as an example. The comparator circuits CP1, CP3, and CP4 have a similar configuration. In FIG. 8, an example in which the selector SLA selects the stop signal STP2 as the trigger signal TRX and the selector SLB selects the threshold voltage Vth2 will be described. Illustrations of the selectors SLA and SLB will be omitted. The comparator circuit CP0 that compares the signal STA to the threshold voltage Vth0 can have a configuration similar to that of the comparator circuit CP2 in FIG. 8.

The comparator circuit CP2 includes switching elements (switches) SWB1 and SWB2 and switching elements (switches) SWB3 and SWB4. ON and OFF of the switching elements SWB1 and SWB2 are controlled by a reset signal RSK. ON and OFF of the switching elements SWB3 and SWB4 are controlled by a logic inversion signal RSKX of the reset signal RSK. The comparator circuit CP2 includes a buffer circuit BFB, a capacitor CB, an inverter (amplifier circuit) IVB1, and an inverter IVB2. The buffer circuit BFB buffers an input voltage and outputs an output voltage which is equal to the input voltage. The capacitor CB is provided between an output of the buffer circuit BFB and an input of the inverter IVB1. An input or an output of the inverter IVB1 is fed back by the switching element SWB2. The output voltage of the inverter IVB1 is input to the inverter IVB2 via the switching element SWB4. The switching elements SWB1 to SWB4 are analog switches and are configured by transistors, for example. The buffer circuit BFB is, for example, an amplifier circuit or, for example, a voltage follower. In FIG. 2, a case where the comparator circuit is configured by the comparator and the buffer circuit is described. In FIG. 8, the switching elements SWB1 to SWB4, the buffer circuit BFB, the capacitor CB, and the inverter IVB1 correspond to the comparator, and the inverter IVB2 corresponds to the buffer circuit.

Figure 9:
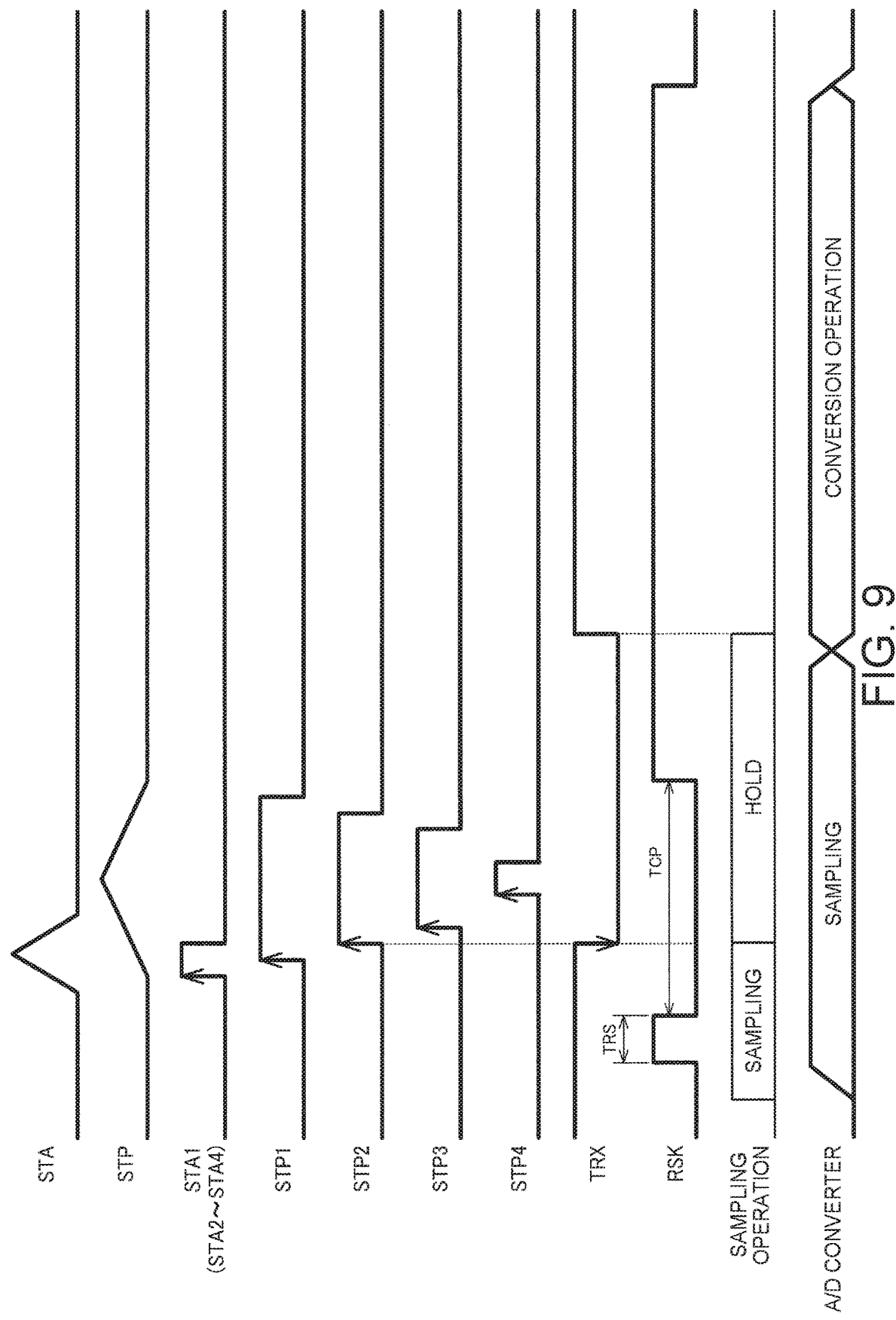
FIG. 9 is a timing chart illustrating an operation of the AFE circuit.

FIG. 9 is a timing chart illustrating an operation of the AFE circuit. Here, the operation of the AFE circuit 30 in a case where the configuration in FIG. 8 is applied to FIG. 7 will be described. In the following descriptions, an operation of the comparator circuit CP2 will be described as an example. The comparator circuits CP1, CP3, and CP4 operate in the similar manner.

As illustrated in FIG. 9, the reset signal RSK has a high level in an initialization period TRS, and thus the switching elements SWB1 and SWB2 of the comparator circuit CP2 turn ON and the switching elements SWB3 and SWB4 thereof turn OFF. In this case, the threshold voltage Vth2 is input to the buffer circuit BFB via the switching element SWB1, and the input or the output of the inverter IVB1 is fed back by the switching element SWB2. The threshold voltage Vth2 buffered by the buffer circuit BFB is input to one end of the capacitor CB, and the threshold voltage (logical threshold voltage) of the inverter IVB1 is input to the other end of the capacitor CB.

Then, the reset signal RSK has a low level in a comparison period TCP. Thus, the switching elements SWB1 and SWB2 of the comparator circuit CP2 turn OFF, and the switching elements SWB3 and SWB4 thereof turn ON. In this case, the signal STP is input to the buffer circuit BFB via the switching element SWB3. The input and the output of the inverter IVB1 are not connected to each other (in a state of not being fed back), and the output of the inverter IVB1 is input to the inverter IVB2 via the switching element SWB4. At this time, a difference between the threshold voltage Vth2 and the threshold voltage of the inverter IVB1 (potential difference subjected to sampling by the capacitor CB in the initialization period TRS) is held in the capacitor CB. A comparison operation can be performed by the potential difference held in the capacitor CB. That is, when the voltage level of the signal STP is lower than the threshold voltage Vth2, the input of the inverter IVB1 is lower than the threshold voltage, and thus the stop signal STP2 has a low level. When the voltage level of the signal STP exceeds the threshold voltage Vth2, the input of the inverter IVB1 exceeds the threshold voltage, and thus the stop signal STP2 changes from the low level to the high level. Similarly, the voltage level of the signal STP in the comparison period TCP is compared to the threshold voltages Vth1, Vth3, and Vth4, and the voltage level of the signal STA is compared to the threshold voltage Vth0.

In the comparison period TCP, if a pulse signal is input as the signal STA, the comparator circuit CP0 compares the voltage level of the signal STA to the threshold voltage Vth0. The start signal STA1 turns from the low level to the high level, and then turns from the high level to the low level. Similarly, if a pulse signal is input as the signal STP, the comparator circuits CP1 to CP4 compare the voltage level of the signal STP to the threshold voltages Vth1 to Vth4, respectively. The stop signals STP1 to STP4 turn from the low level to the high level, and then turn from the high level to the low level. In a case of Vth1<Vth2<Vth3<Vth4, the voltage level turns from the low level to the high level in order of STP1, STP2, STP3, and STP4. Then, the voltage level turns from the high level to the low level in order of STP4, STP3, STP2, and STP1.

If the stop signal STP2 turns from the low level to the high level, the trigger signal TRX turns from the high level to the low level. A sampling operation of the measurement circuit 32 is in a sampling state in a period in which the trigger signal TRX has a high level. That is, the switching element SWA turns ON and the voltage level of the signal STP is subjected to sampling by the capacitor CA. If the trigger signal TRX turns from the high level to the low level, the switching element SWA turns from an ON state to an OFF state, and the voltage level (Vsmp) of the signal STP at this time is held in the capacitor CA. The trigger signal TRX is held to have a low level until a given timing. A sampling voltage is held in the capacitor CA during a period in which the trigger signal is held to have a low level. The given timing is, for example, a timing after the A/D converter ADC ends sampling of the input voltage.

The amplifier circuit AMP amplifies the differential voltage between the voltage (Vsmp) held in the capacitor CA, and the threshold voltage Vth2. The A/D converter ADC performs sampling and holds an output differential voltage of the amplifier circuit AMP and performs A/D conversion on the held voltage. An end timing of sampling (timing in which the voltage is held) is a given timing in a period from an end of the comparison period TCP until the trigger signal TRX turns from the low level to the high level. For example, in a case where the A/D converter ADC is a successive approximation type A/D conversion circuit, the A/D converter ADC performs a successive approximation operation in a conversion operation and outputs A/D conversion data obtained by the successive approximation operation, as the information MSQ of the measurement voltage.

According to the above-described embodiment, the measurement circuit 32 includes the sampling circuit and the A/D conversion circuit 34. The sampling circuit performs sampling on the voltage level of the target signal (STP) at a transition timing of the i-th comparison result signal (STPi, i is an integer of 1 to n) of the comparison result signals (STA1 to STA4, first to n-th comparison result signals). The voltage level (Vsmp) subjected to sampling by the sampling circuit and the i-th threshold voltage Vthi(Vths) of the threshold voltages Vth1 to Vth4 are input to the A/D conversion circuit 34. The A/D conversion circuit 34 performs A/D conversion on the differential voltage between the voltage level (Vsmp) subjected to sampling by the sampling circuit, and the i-th threshold voltage Vthi, as the measurement voltage Vos.

In FIGS. 7 and 8, the sampling circuit corresponds to the switching element SWA and the capacitor CA. In FIGS. 7 and 8, the A/D conversion circuit 34 includes the amplifier circuit AMP and the A/D converter ADC. However, it is not limited thereto. For example, the amplifier circuit AMP may be omitted. That is, the voltage level subjected to sampling by the sampling circuit, and the i-th threshold voltage Vthi may be input to the A/D converter ADC.

According to the embodiment, the voltage level of the target signal at the transition timing of the i-th comparison result signal (STPi) is subjected to sampling, and the differential voltage between the voltage level (Vsmp) subjected to sampling and the i-th threshold voltage Vthi is subjected to A/D conversion, as the measurement voltage (Vos). Thus, the measurement voltage can be measured based on the voltage level of the target signal at the transition timing of the comparison result signal of the comparator circuit.

In the embodiment, the measurement circuit 32 includes the selector SLA that selects any of the comparison result signals (STP1 to STP4, first to n-th comparison result signals), as the i-th comparison result signal (STPi). The sampling circuit performs sampling on the voltage level of the target signal (STP) at the transition timing of the i-th comparison result signal (STPi) selected by the selector.

According to this configuration, the voltage level of the target signal at the transition timing of at least one of the comparison result signals (STP1 to STP4) can be subjected to sampling. Specifically, the voltage level of the target signal at the transition timing of the i-th comparison result signal (STPi) can be subjected to sampling.

In the embodiment, the j-th comparator circuit (j is an integer of 1 to n) CPj of the comparator circuits CP1 to CP4 includes the capacitor CB having the one end to which the threshold voltage Vthj of the threshold voltages Vth1 to Vth4 is input in the initialization period TRS and to which the target signal (STP) is input in the comparison period TCP, and the amplifier circuits (IVB1 and SWB2) connected to the other end of the capacitor CB.

According to this configuration, it is possible to hold a potential difference using the threshold voltage Vthj as the reference, in the capacitor CB by inputting the threshold voltage Vthj to the one end of the capacitor CB in the initialization period TRS. Since the target signal is input to the one end of the capacitor CB in the comparison period TCP, the voltage at the other end of the capacitor CB can be changed with changing the voltage level of the target signal in a state where the potential difference between both the ends of the capacitor CB is held. The voltage at the other end of the capacitor CB is input to the amplifier circuit, and the comparison result signal can be output based on the output of the amplifier circuit.

In the embodiment, the amplifier circuit includes the inverter IVB1 and the switch (SWB2). The switch connects the output and the input of the inverter IVB1 to each other in the initialization period TRS and does not connect the output and the input of the inverter in the comparison period TCP.

According to this configuration, if the output and the input of the inverter IVB1 are connected to each other in the initialization period TRS, the voltage at the other end of the capacitor CB serves as the threshold voltage (logical threshold voltage) of the inverter IVB1. Thus, the difference between the threshold voltage Vthj and the threshold voltage of the inverter IVB1 is held as the potential difference between both the ends of the capacitor CB. Since the output and the input of the inverter are not connected to each other in the comparison period TCP, the inverter IVB1 functions as an amplifier circuit that amplifies (inverts and amplifies) a voltage at the other end of the capacitor CB. The output voltage of the amplifier circuit substantially has a low level (first power supply voltage, power supply voltage on a low potential side) or a high level (second power supply voltage, power supply voltage on a high potential side). In a case where the differential voltage between the input voltage (voltage at the other end of the capacitor CB) and the given threshold voltage is positive, a voltage of the low level is output. In a case where the differential voltage is negative, a voltage of the high level is output. Thus, the timing at which the voltage level of the target signal exceeds the threshold voltage Vthj can be detected and a detection result can be output as the comparison result signal.

Figure 10:
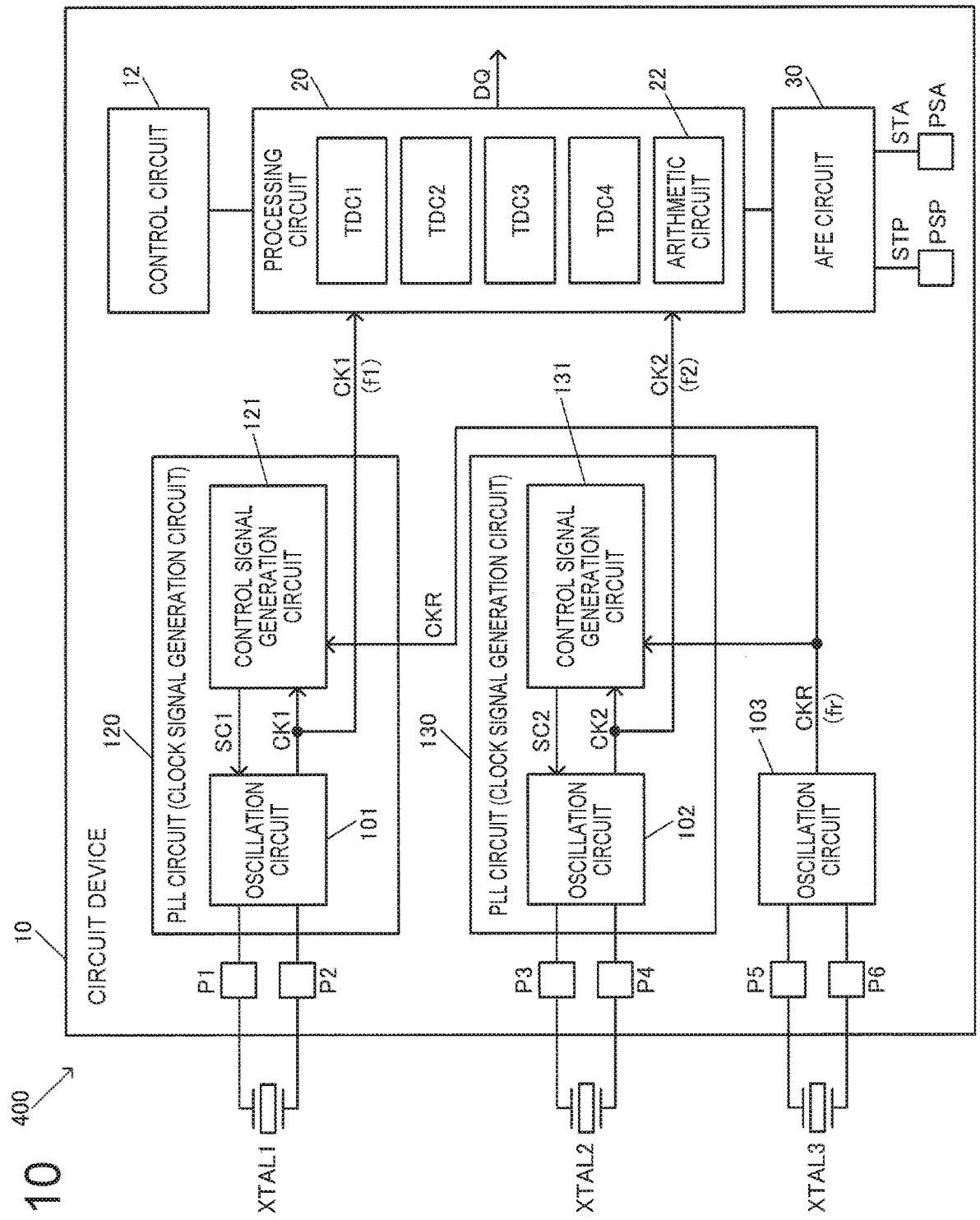
FIG. 10 illustrates a second configuration example of the circuit device and the physical quantity measuring device in the embodiment.

4. Second Configuration Example of Circuit Device and Physical Quantity Measuring Device FIG. 10 illustrates a second configuration example of the circuit device in the embodiment and the physical quantity measuring device including the circuit device. The physical quantity measuring device 400 includes first to third resonators XTAL1 to XTAL3 and the circuit device 10. The circuit device 10 includes the AFE circuit 30, the processing circuit 20, and first and second PLL circuits 120 and 130. The circuit device 10 may include an oscillation circuit 103, a control circuit 12, signal terminals PSA and PSP, and oscillation terminals P1 to P6. The physical quantity measuring device 400 may be configured as the distance measuring device which further includes the light-emitting unit 420, the light-receiving unit 430, and the like as illustrated in FIG. 1.

The resonators XTAL1 to XTAL3 are realized, for example, by resonator elements (piezoelectric resonator elements) such as quartz crystal resonator elements. For example, the resonators are realized by quartz crystal resonator elements and the like which has a cut angle of AT cut, SC cut, or the like and performs thickness shear mode resonance. The resonators XTAL1 to XTAL3 in the embodiment are not limited thereto. For example, the resonators can be realized by various resonator elements such as resonator elements (other than a thickness shear mode type) or piezoelectric resonator elements formed of a material other than quartz crystal.

The AFE circuit 30 performs waveform shaping of the signals STA and STP from the signal terminals PSA and PSP. The processing circuit 20 converts a time difference in transition timing between the signals STA and STP subjected to waveform shaping, to a digital value DQ. The oscillation circuit 103 performs an oscillation operation of oscillating the resonator XTAL3 so as to generate the reference clock signal CKR having a clock frequency of fr. The PLL circuits 120 and 130 generate the clock signals CK1 and CK2 having phases synchronized with the reference clock signal CKR, respectively. Specifically, the control signal generation circuit 121 of the PLL circuit 120 outputs a control signal SC1 which is based on phase comparison between the clock signal CK1 from the oscillation circuit 101 and the reference clock signal CKR from the oscillation circuit 103, to the oscillation circuit 101 and thus causes the phase of the clock signal CK1 to be synchronized with the phase of the clock signal CKR. The control signal generation circuit 131 of the PLL circuit 130 outputs a control signal SC2 which is based on phase comparison between the clock signal CK2 from the oscillation circuit 102 and the reference clock signal CKR from the oscillation circuit 103, to the oscillation circuit 102 and thus causes the phase of the clock signal CK2 to be synchronized with the phase of the clock signal CKR. Since the phases of the clock signals CK1 and CK2 are synchronized with the reference clock signal CKR, the phase of the clock signals CK1 and CK2 are synchronized with each other and thus it is possible to hold a frequency relationship or a phase relationship between the clock signals CK1 and CK2 to be a predetermined relationship. For example, in a case where the clock frequencies of the clock signals CK1 and CK2 are set as f1 and f2, a control of holding a frequency relationship of N/f1=M/f2 (N and M are integers which are 2 or greater and different from each other) is performed by the PLL circuits 120 and 130 (synchronization circuit, control unit). If time-digital conversion is performed by using such clock signals CK1 and CK2, it is possible to perform time-digital conversion by setting the clock signals CK1 and CK2 to have an appropriate frequency relationship. Thus, it is possible to realize time-digital conversion having high performance. The control circuit 12 is realized by a logic circuit, for example. The control circuit performs various kinds of processing such as control processing of the circuit device 10. For example, the control circuit 12 outputs setting information (code value) to the D/A conversion circuits DACA and DACB in FIG. 7, outputs control signals for controlling the selectors SLA and SLB, or outputs the reset signal RSK in FIG. 8. The oscillation circuits 101, 102, and 103 may include a power source circuit (regulator) that supplies power to the oscillation circuits and the like, in addition to circuit elements such as a buffer circuit, a resistor, and a capacitor.

In the embodiment, a case where three resonators XTAL1 to XTAL3 are provided is mainly described. However, the embodiment is not limited thereto. The number of resonators may be 2 or may be 4 or greater. For example, in FIG. 10, two PLL circuits 120 and 130 are provided. However, a configuration in which only one PLL circuit is provided may be made. For example, the PLL circuit performs phase synchronization between clock signals CK1 and CK2 in a manner that phase comparison is performed between the clock signal CK1 generated by a first oscillation circuit and the clock signal CK2 generated by a second oscillation circuit (VCXO) in the PLL circuit, and an oscillation frequency of the second oscillation circuit is controlled based on a phase comparison result (control voltage). In this case, only two resonators for the first and second oscillation circuits may be provided.

5. Time-Digital Conversion

Figure 11:
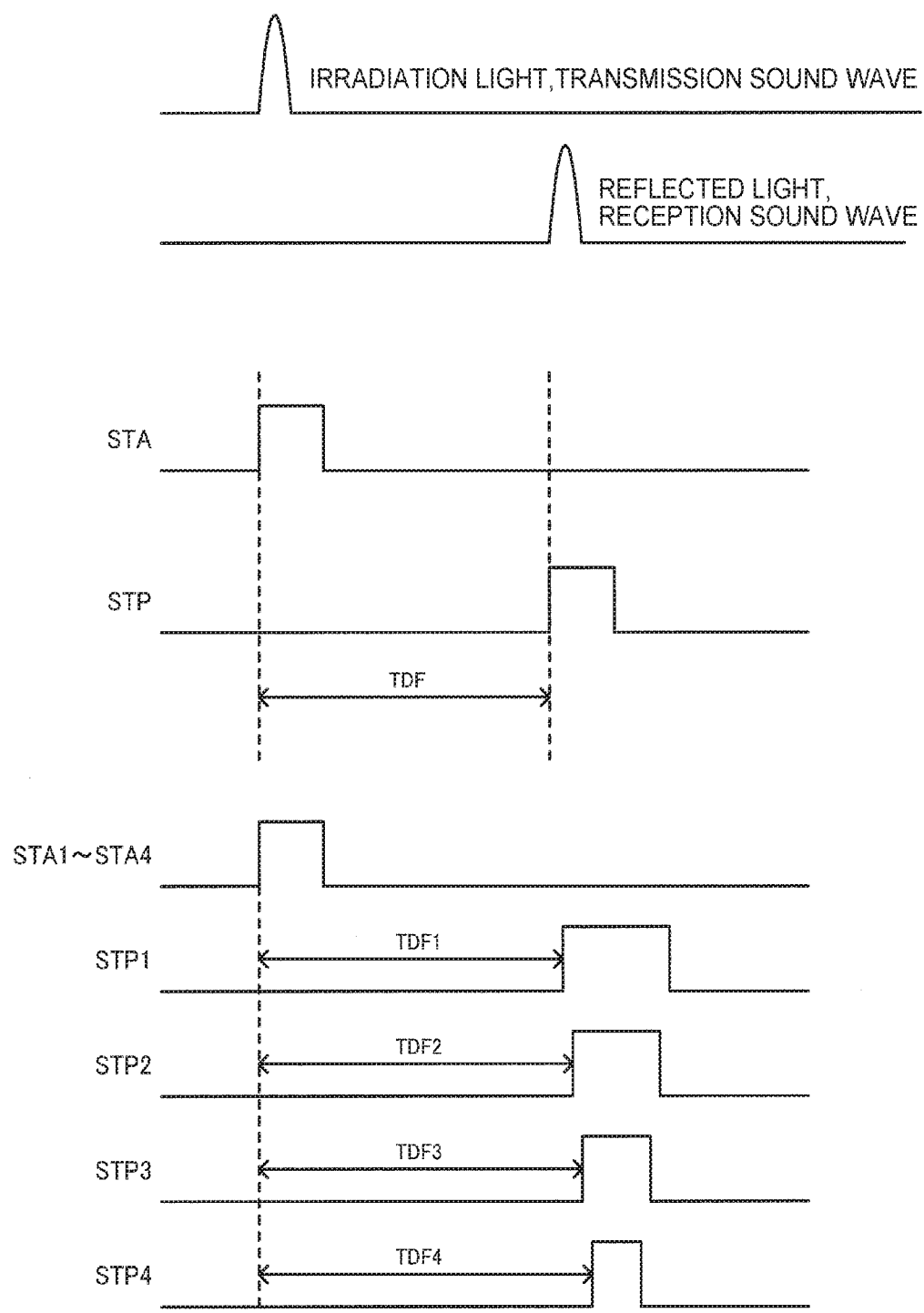
FIG. 11 is a diagram illustrating a relationship between signals.

Next, a detailed example of time-digital conversion will be described. FIG. 11 illustrates a relationship between the signal (start signal) STA and the signal (stop signal) STP. The processing circuit 20 converts a time difference TDF in transition timing between the signals STA and STP to a digital value DQ. Specifically, the AFE circuit 30 generates the start signals STA1 to STA4 by performing waveform shaping of the signal STA and generates the stop signals STP1 to STP4 by performing waveform shaping of the signal STP. The time-to-digital converter TDC1 converts a time difference TDF1 in transition timing between the signals STA1 and STP1 into a time-digital conversion value DQ1. Similarly, the time-to-digital converters TDC2, TDC3, and TDC4 convert a time difference TDF2 in transition timing between the signals STA2 and STP2, a time difference TDF3 in transition timing between the signals STA3 and STP3, and a time difference TDF4 in transition timing between the signals STA4 and STP4, to time-digital conversion values DQ2, DQ3, and DQ4, respectively. The arithmetic circuit 22 obtains the digital value DQ of the time difference TDF based on the time-digital conversion values DQ1 to DQ4 of the time differences TDF1 to TDF4. The digital value DQ is obtained by the method described in Expressions (1) to (3), for example. That is, TDF in FIG. 11 is obtained as t0 in Expression (1) by substituting TDF1 and TDF2 in FIG. 11 to t1 and t2 in Expressions (2) and (3).

In FIG. 11, TDF indicates a time difference between transition timings when the signals STA and STP rise (between rising edges). However, TDF may indicate a time difference between transition timings when the signals STA and STP fall (between falling edges). For example, in the embodiment, as illustrated in FIG. 1, irradiation light (for example, laser light) is emitted to a target (for example, object around a car) by using the signal STA. The signal STP is generated by receiving reflected light from the target. According to this configuration, it is possible to measure a distance from the target as the physical quantity, for example, in a manner of time of flight (TOF), by converting a time difference TDF in transition timing between the signals STA and STP into a digital value DQ. Thus, it is possible to use the measured distance for automated driving of cars and motion control of robots, for example. Alternatively, in the embodiment, a transmission sound wave (for example, ultrasonic wave) is transmitted to a target (for example, living body) by using the signal STA. The signal STP is generated by receiving a reception sound wave from the target. According to this configuration, it is possible to measure a distance and the like from the target and to, for example, measure biological information by the ultrasonic wave. In FIG. 11, transmission data may be transmitted by the signal STA. A time from the transmission data is transmitted until reception data is received may be measured by the signal STP generated by receiving the reception data. The physical quantity measured in the embodiment is not limited to the time and the distance. Various kinds of physical quantities such as a flow quantity, a flow rate, a frequency, a velocity, acceleration, an angular velocity, and angular acceleration are considered.

Figure 12:
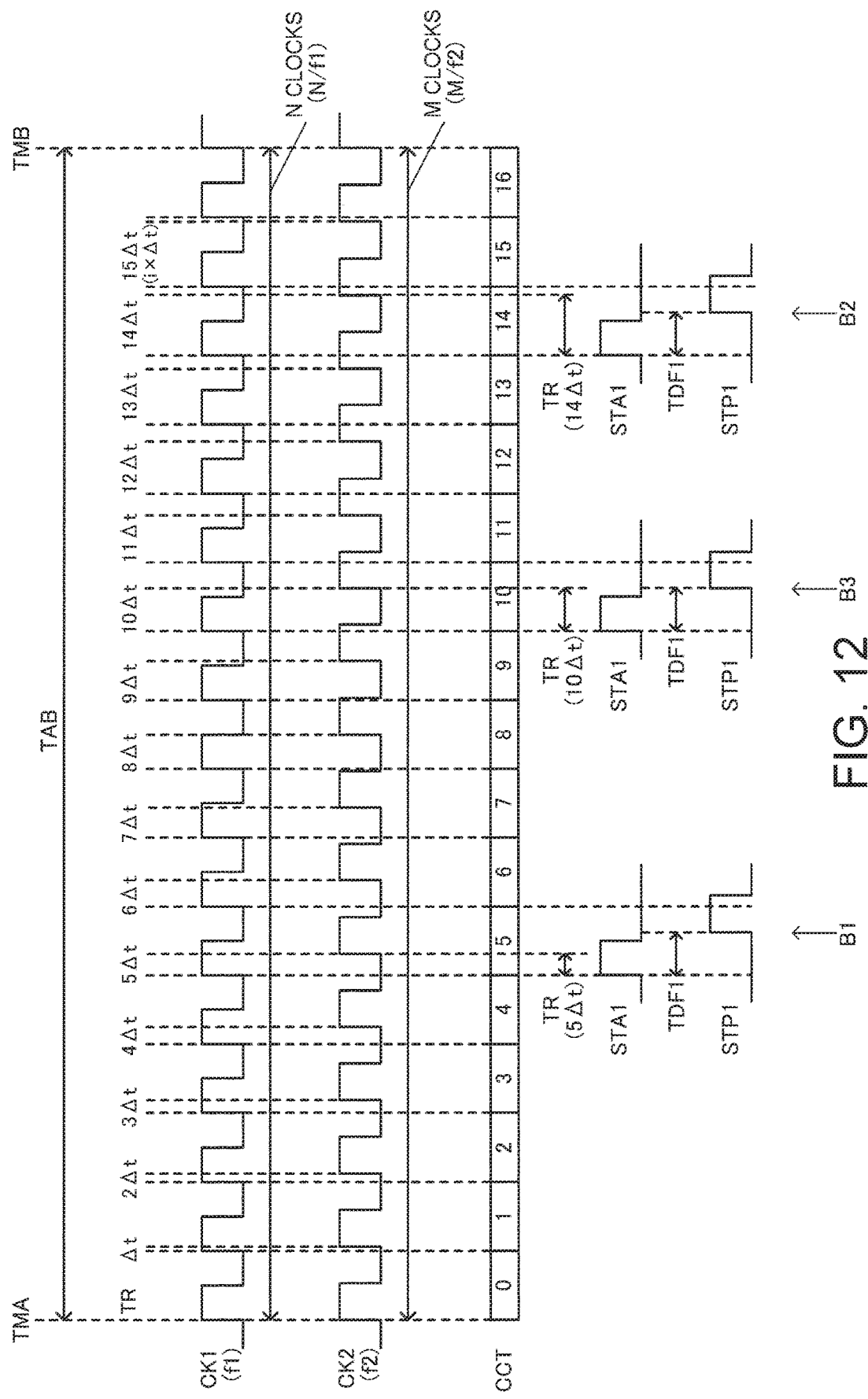
FIG. 12 is a signal waveform diagram illustrating a time-digital conversion method in the embodiment.

FIG. 12 is a signal waveform diagram illustrating a time-digital conversion method in the embodiment. In the following descriptions, an operation of the time-to-digital converter TDC1 will be described as an example. The time-to-digital converters TDC2 to TDC4 perform the similar operations.

Phase synchronization between clock signals CK1 and CK2 is performed at a phase synchronization timing TMA and transition timings of the clock signals CK1 and CK2 coincide with each other. Then, the time difference TR (phase difference) between clocks of the clock signals CK1 and CK2 is increased for each clock cycle (CCT) by $\Delta t$ so as to come to $\Delta t$, $2\Delta t$, $3\Delta t$, . . . . For example, phase synchronization between the clock signals CK1 and CK2 is performed at the next phase synchronization timing TMB and transition timings of the clock signals CK1 and CK2 coincide with each other.

In the embodiment, a time is converted to a digital value by using a plurality of resonators XTAL1 and XTAL2 and using the clock frequency difference therebetween. That is, the time-to-digital converter TDC1 converts a time into a digital value at resolution corresponding to the frequency difference ($|f1-f2|$) between the clock frequencies f1 and f2. The time-to-digital converter converts the time into the digital value by using the principle of a Vernier caliper, for example. According to this configuration, resolution of time-digital conversion can be set by using the frequency difference ($|f1-f2|$), and thus it is possible to, for example, improve performance of time-digital conversion, such as accuracy or resolution. Specifically, the resolution (time resolution) in time-digital conversion can be represented by $\Delta t=|1/f1-1/f2|=|f1-f2|/(f1 \times f2)$. Thus, the time-to-digital converter TDC1 converts a time into a digital value at resolution $\Delta t$ satisfying $\Delta t=|1/f1-1/f2|=|f1-f2|/(f1 \times f2)$. The resolution is represented by $\Delta t=|f1-f2|/(f1 \times f2)$ and corresponds to the frequency difference ($|f1-f2|$).

According to this configuration, the resolution in time-digital conversion can be set by setting the clock frequencies f1 and f2. For example, it is possible to reduce the resolution $\Delta t$ by reducing the frequency difference ($|f1-f2|$), and to realize time-digital conversion having high resolution. It is possible to reduce the resolution $\Delta t$ by setting the clock frequencies f1 and f2 to be high frequencies, and to realize time-digital conversion having high resolution. If the clock signals CK1 and CK2 are generated by the resonators XTAL1 and XTAL2, accuracy of time-digital conversion is also improved in comparison to a case using a delay element of a semiconductor element. In particular, in the embodiment, since quartz crystal resonators are used as the resonators XTAL1 and XTAL2, it is possible to suppress fluctuation in the clock frequencies f1 and f2 occurring by manufacturing variation or environmental fluctuation such as temperature fluctuation, to the minimum. Thus, it is possible to also suppress fluctuation of the resolution $\Delta t=|f1-f2|/(f1 \times f2)$ to the minimum and to realize further improvement of the performance of time-digital conversion.

As illustrated in FIG. 12, the length of a period TAB between the phase synchronization timings TMA and TMB corresponds to N clocks of the clock signal CK1. The length of the period TAB corresponds to M clocks of the clock signal CK2. Here, N and M are integers of 2 or greater, which are different from each other. In FIG. 12, N is set to 17, M is set to 16, and N–M=1 is satisfied. A relationship of TAB=N/f1=M/f2 is established. If f2 is set to 16 MHz, N is set to 17, and M is set to 16, f1 comes to 17 MHz and a relational expression of N/f1=M/f2 is established. For example, at least one of the oscillation circuits 101 and 102 is controlled to establish the relationship of N/f1=M/f2. According to this configuration, the transition timings of the clock signals CK1 and CK2 coincide with each other at the phase synchronization timing TMA, and then the time difference TR (phase difference) between clocks is increased by $\Delta t$ so as to come to $\Delta t$, $2\Delta t$, $3\Delta t$, . . . . Thus, the transition timings of the clock signals CK1 and CK2 coincide with each other at the next phase synchronization timing TMB and thus the time difference TR between clocks is 0. Then, the time difference TR between clocks is increased for each clock cycle by $\Delta t$.

As described above, the time difference TR is 0 at the phase synchronization timing and then the time difference TR between clocks is made by increasing the time difference TR by $\Delta t$ (resolution). Thus, it is possible to realize time-digital conversion in which a time is converted into a digital value at the resolution $\Delta t$. In the processing of time-digital conversion at the resolution $\Delta t$, as illustrated in FIG. 12, the time difference TR between clocks in each clock cycle (CCT) in the period TAB can be uniquely specified. Thus, the processing of time-digital conversion or a circuit configuration is simplified. The accuracy of time-digital conversion is also improved by causing transition timings of the clock signals CK1 and CK2 coinciding (substantially coinciding) with each other at the phase synchronization timings TMA and TMB.

In the embodiment, even in a case where the clock frequency fluctuates by manufacturing variation or environmental fluctuation, for example, at least one of the oscillation circuits 101 and 102 is controlled by the PLL circuits 120 and 130 (synchronization circuits) so as to cause the clock signals CK1 and CK2 to have a given frequency relationship or phase relationship. Thus, the frequency relationship or the phase relationship between the clock signals CK1 and CK2 is adjusted such that the fluctuation caused by the manufacturing variation or environmental fluctuation is compensated. Thus, even in a case where such fluctuation occurs, it is possible to realize appropriate time-digital conversion. It is possible to prevent degradation of conversion accuracy occurring by shift of the transition timings of the clock signals CK1 and CK2 at the phase synchronization timings TMA and TMB. Thus, the performance of time-digital conversion is improved.

As described above, in the embodiment, the oscillation circuits are controlled to establish the relational expression of $N/f1=M/f2$. The resolution in time-digital conversion is represented by a relational expression of $\Delta t=|f1-f2|/(f1 \times f2)$. Thus, Expression (4) is established.

$$\Delta t=|N-M|/(N \times f2)=|N-M|/(M \times f1) \quad (4)$$

According to this configuration, the clock signals CK1 and CK2 can be generated by setting N, M, and the like in accordance with the resolution $\Delta t$ required for time-digital conversion. For example, it is assumed that resolution of $\Delta t=2$ ns (nanoseconds) is required as the resolution in time-digital conversion and the clock frequency f2 of the clock signal CK2 is 100 MHz. In this case, it is possible to realize time-digital conversion at the resolution $\Delta t$ satisfying $|5-4|/(5 \times f2)=2$ ns by setting N to 5 and M to 4 in Expression (4). At this time, the clock frequency f1 of the clock signal CK1 satisfies $(N/M) \times f2=125$ MHz based on the relational expression of $N/f1=M/f2$. In addition, it is assumed that resolution of $\Delta t=1$ ps (picoseconds) is required as the resolution in time-digital conversion and the clock frequency f2 of the clock signal CK2 is 122.865 MHz. In this case, it is possible to realize time-digital conversion at the resolution $\Delta t$ satisfying $|8139-8138|/(8139 \times f2)=1$ ps by setting N to 8139 and M to 8138 in Expression (4). At this time, the clock frequency f1 of the clock signal CK1 satisfies $(N/M) \times f2=122.880$ MHz based on the relational expression of $N/f1=M/f2$.

In FIG. 12, after the phase synchronization timing TMA, a time difference TR between clocks, which is a time difference between the transition timings of the clock signals CK1 and CK2 in the first to i-th clock cycles (i is an integer of 2 or greater) is $\Delta t$ to $i \times \Delta t$. For example, TR is $\Delta t$ in the first clock cycle (CCT=1) after the phase synchronization timing TMA. Similarly, TR is $2\Delta t$ to $15\Delta t$ in the second to the 15th clock cycles (CCT=2 to 15). That is, the time difference TR between clocks in the j-th clock cycle ($1 \leq j \leq i$) is $j \times \Delta t$.

In this case, in the embodiment, the time-digital conversion value DQ1 corresponding to TR is obtained in a manner that one of $\Delta t$ to $i \times \Delta t$ as the time difference TR between clocks regarding transition timings of the clock signals CK1 and CK2 corresponds to the time difference TDF1 between the transition timings of the signals STA1 and STP1. For example, TR is $5\Delta t$ in a clock cycle (CCT=5) indicated by B1 in FIG. 12. The time difference TDF1 between the signals STA1 and STP1 is longer than TR=$5\Delta t$ and TDF1>TR=$5\Delta t$ is satisfied. TR is $14\Delta t$ in a clock cycle (CCT=14) indicated by B2. TDF1 is shorter than TR=$14\Delta t$ and TDF1<TR=$14\Delta t$ is satisfied. TR is $10\Delta t$ in a clock cycle (CCT=10) indicated by B3. TDF1 is equal to (substantially the same as) TR=$10\Delta t$ and TDF1<TR=$10\Delta t$ is satisfied. Thus, the time difference TDF1 between the signals STA1 and STP1 is specified to correspond to TR=$10\Delta t$. As a result, it can be determined that the time-digital conversion value DQ1 corresponding to the time difference TDF1 is, for example, a digital value corresponding to TR=$10\Delta t$. According to this configuration, it is possible to realize time-digital conversion in which the time difference TDF1 between the signals STA1 and STP1 is obtained by using the time difference TR between clocks with increasing by $\Delta t$, after the phase synchronization timing TMA.

Figure 13:
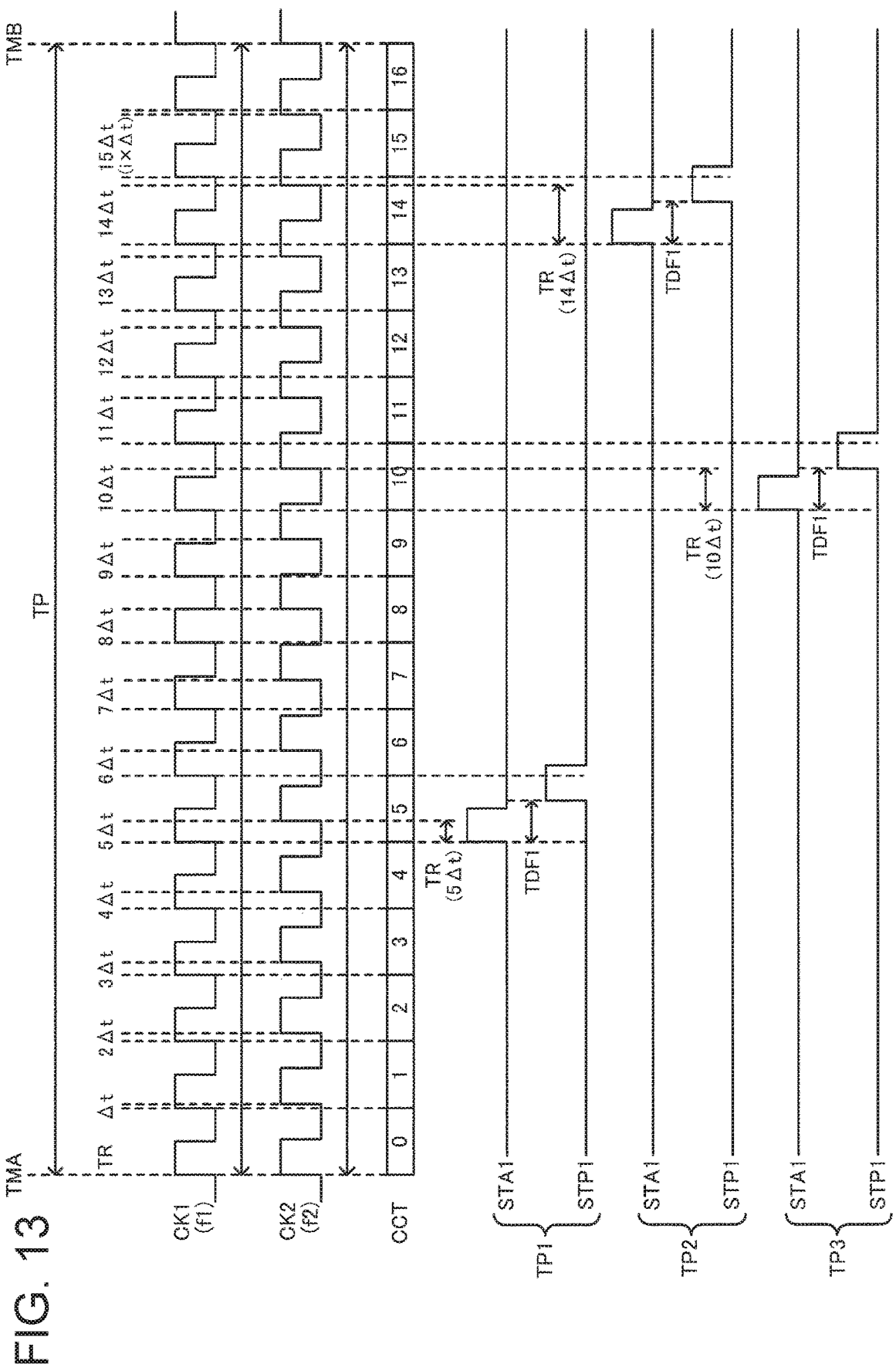
FIG. 13 illustrates an example of a specific method of time-digital conversion in the embodiment.

FIG. 13 illustrates an example of a specific method of time-digital conversion in the embodiment. For example, a period between the phase synchronization timings TMA and TMB is set to be an update period TP. Specifically, a period between first and second phase synchronization timings for the clock signals CK1 and CK2 is an update period TP1, a period between second and third phase synchronization timings is an update period TP2, and a period between third and fourth phase synchronization timings is an update period TP3. The update period TP2 is an update period next to the update period TP1 and the update period TP3 is an update period next to the update period TP2. The subsequent update periods are similar.

In this case, the processing circuit 20 generates the signal STA1, for example, in the fifth clock cycle (m-th clock cycle and m is an integer of 1 or greater) in the update period TP1. Then, the processing circuit 20 acquires the signal STP1 which corresponds to the generated signal STA1 and has a changed signal level. Processing of comparing the time difference TDF1 between the signals STA1 and STP1 in the fifth clock cycle to the time difference TR=$5\Delta t$ between clocks is performed. Here, the result of the comparison processing in that TDF1 is longer than TR=$5\Delta t$ is obtained.

The processing circuit 20 generates the signal STA1 in the 14th clock cycle (n-th clock cycle and n is an integer of 1 or greater. m and n are integers different from each other) set in accordance with the result of the comparison processing in the update period TP1, in the update period TP2 next to the update period TP1. The processing circuit 20 acquires the signal STP1 which corresponds to the generated signal STA1 and has a changed signal level. For example, the result of comparison processing in that TDF1 is longer than TR=$5\Delta t$ is obtained in the update period TP1. Therefore, a clock cycle is set to cause TR to increase, in the next update period TP2. For example, the processing circuit 20 generates the signal STA1 in the fifth clock cycle causing TR=$5\Delta t$, in the update period TP1, but generates the signal STA1 in the 14th clock cycle causing TR=$14\Delta t$, in the update period TP2. Processing of comparing TDF1 in the 14th clock cycle to TR=$14\Delta t$ is performed. Here, the result of the comparison processing in that TDF1 is longer than TR=$14\Delta t$ is obtained.

The processing circuit 20 generates the signal STA1 in the 10th clock cycle (CCT=10) set in accordance with the result of the comparison processing in the update period TP2, in the update period TP3 next to the update period TP2. For example, the result of the comparison processing in that TDF1 is shorter than TR=$14\Delta t$ is obtained in the update period TP2. Thus, a clock cycle causing TR to be reduced is set. For example, the processing circuit 20 generates the signal STA1 in the 10th clock cycle causing TR=$10\Delta t$. Processing of comparing TDF1 in the 10th clock cycle to TR=$10\Delta t$ is performed. Here, the result of the comparison processing in that TDF1 is equal to (substantially equal to) TR=$10\Delta t$ is obtained. Thus, it is determined that the time-digital conversion value DQ1 corresponding to the time difference TDF1 is a digital value corresponding to TR=$10\Delta t$.

As described above, in FIG. 13, feedback of the result of the comparison processing in the previous update period is performed so as to set a clock cycle for generating the signal STA1 in the current update period. Then, the comparison processing between TDF1 and TR is performed. As described above, it is possible to increase the speed of time-digital conversion by performing feedback of the result of the comparison processing in the previous update period. Even in a case where the time or the physical quantity as a measurement target changes dynamically, it is possible to realize time-digital conversion following the dynamic change.

Various modifications of time-digital conversion in the embodiment may be made. For example, a method (repetitive method) of obtaining the time-digital conversion value DQ1 corresponding to the time difference TDF1 in a manner that the signal STA1 is generated plural times in one measurement period in which a time is measured and phase comparison is performed plural times (for example, 1000 times or greater) may be employed. Alternatively, in FIG. 13, a clock cycle designation value (clock cycle designation information) for designating a clock cycle in which the signal STA1 is generated is stored in the storage unit (register) of the circuit device 10. A method of obtaining the time-digital conversion value DQ1 corresponding to the time difference TDF1 in a manner that processing of sequentially updating the clock cycle designation value stored in the storage unit is performed based on a result obtained by performing phase comparison between the signal STP1 and the clock signal CK2 in each of update periods TP1, TP2, TP3, . . . (method of updating a clock cycle designation value) may be employed. Alternatively, a method of obtaining the time-digital conversion value DQ1 corresponding to the time difference TDF1 between the transition timings of the signals STA1 and STP1, at resolution corresponding to the frequency difference between the clock frequencies f1 and f2 by binary search (binary search method) may be employed. Specifically, update of the clock cycle designation value based on the phase comparison result between the signal STP1 and the clock signal CK2 is realized by binary search. Alternatively, a search range of the time-digital conversion value DQ1 may be narrowed by the method of binary search. Then, the signal STA1 may be generated for each clock cycle and phase comparison may be performed, by the method of updating the clock cycle designation value, in a period corresponding to the narrowed search range. Finally, the time-digital conversion value DQ1 may be obtained. Alternatively, the time-digital conversion value DQ1 corresponding to the time difference TDF1 between the transition timings of the signals STA1 and STP1 may be obtained based on the clock signals CK1 and CK2 generated by the resonators XTAL1 and XTAL2 and the signal STA1 which is input from the outside of the circuit device 10 instead of spontaneously generating the signal STA1 in the circuit device 10. For example, time-digital conversion may be performed while the oscillation circuits 101 and 102 perform an oscillation operation of the resonators XTAL1 and XTAL2 in a manner of free run.

6. Modification Example

Next, modification examples in the embodiment will be described. In FIGS. 12 and 13 described above, spontaneous type time-digital conversion of spontaneously generating the signal STA is described. In a case of a spontaneous type, the circuit device 10 outputs the generated signal STA from, for example, the signal terminal PSA in FIG. 10 to the outside thereof. An external driving circuit having a pulsar and the like outputs the start pulse (driving signal) to a transmission device such as a light-emitting unit, based on the output signal STA. For example, in a case where the driving circuit is controlled by an external processing device such as a microcomputer, the signal STA may be output to the processing device and the processing device may instruct the driving circuit to output the start pulse. The driving circuit may be built in the transmission device such as the light-emitting unit. The signal STP which is the stop pulse is input from the receiving device such as the light-receiving unit to the signal terminal PSP of the circuit device 10 and time-digital conversion is performed.

In this case, a time difference by a delay of the signal is provided in a period from an output timing of the signal STA of the circuit device 10 to an output timing of the start pulse of the driving circuit. The time difference serves as an offset of a time-digital conversion value. In order to remove such an offset, for example, the start pulse (alternatively, start instruction signal of the processing device) output by the driving circuit may be brought back to the circuit device 10, and the start pulse (start instruction signal) may be input, as a signal STA', to the signal terminal PSA in FIG. 10. At this time, the signal STA may be output from the signal terminal PSA and the signal STA' from the driving circuit may be input to the signal terminal PSA, by using the signal terminal PSA as an input and output terminal. Alternatively, a terminal which is used for outputting the signal STA and is separate from the signal terminal PSA may be provided. The processing circuit 20 obtains a time difference TDSTA from a transition timing of the signal STA which has been spontaneously generated to a transition timing of the signal STA' input from the external driving circuit (processing device), by the method described with reference to FIGS. 12 and 13. In addition, the processing circuit 20 obtains a time difference TDSTP from the transition timing of the signal STA to the transition timing of the signal STP. For example, a first time-digital conversion unit obtains the time difference TDSTA, and a second time-digital conversion unit obtains the time difference TDSTP. The time-digital conversion value (DQ) may be finally obtained from a differential value (TDSTP-TDSTA) of the time differences. According to this configuration, it is possible to remove an offset occurring by the time difference which occurs by the above-described signal delay, and to realize more appropriate time-digital conversion. It is not necessary that the time difference TDSTA is normally obtained. For example, the time difference TDSTA may be obtained only at an initial setting time such as a power-supplied time.

Figure 14:
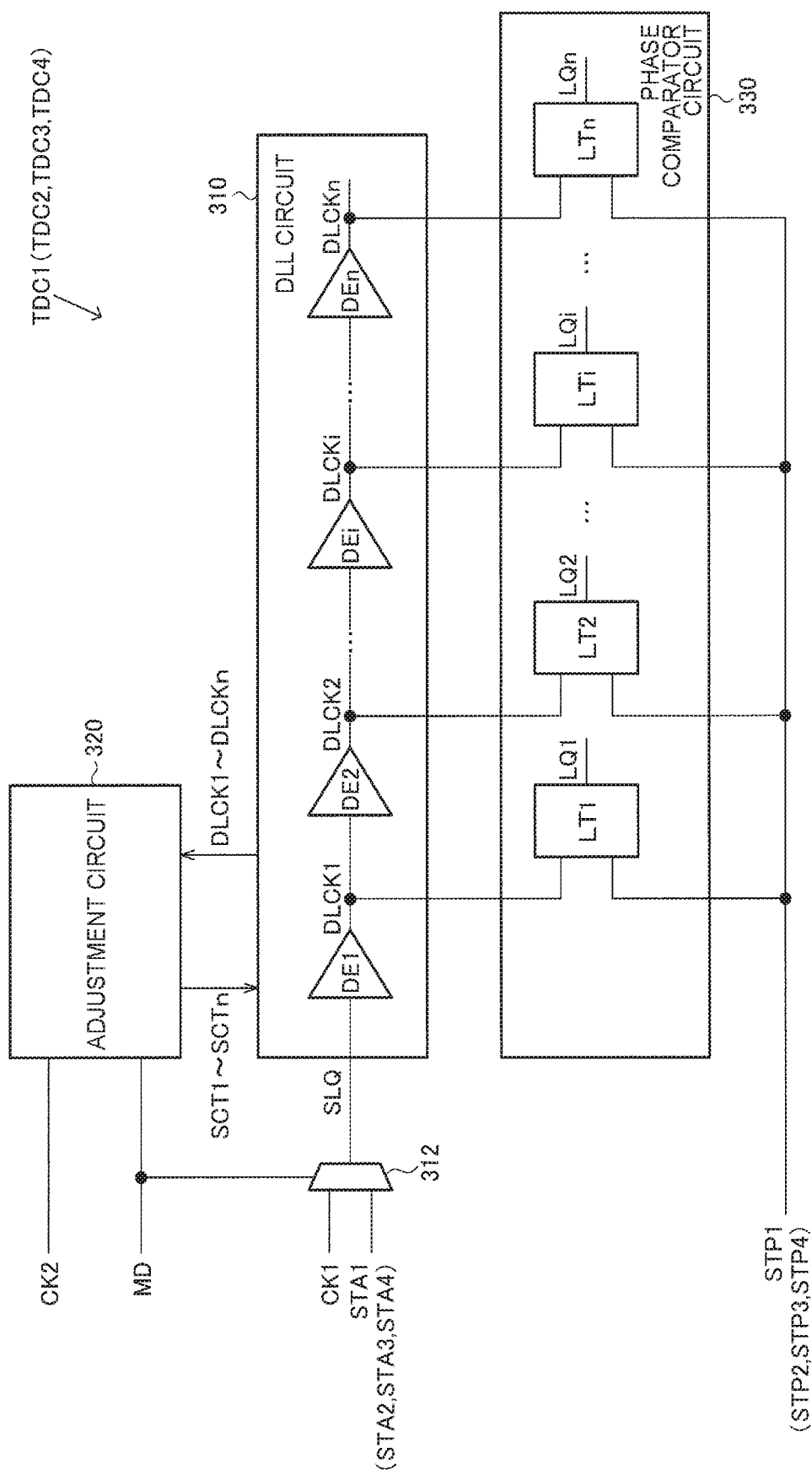
FIG. 14 illustrates a first modification example of a time-to-digital converter.
Figure 15:
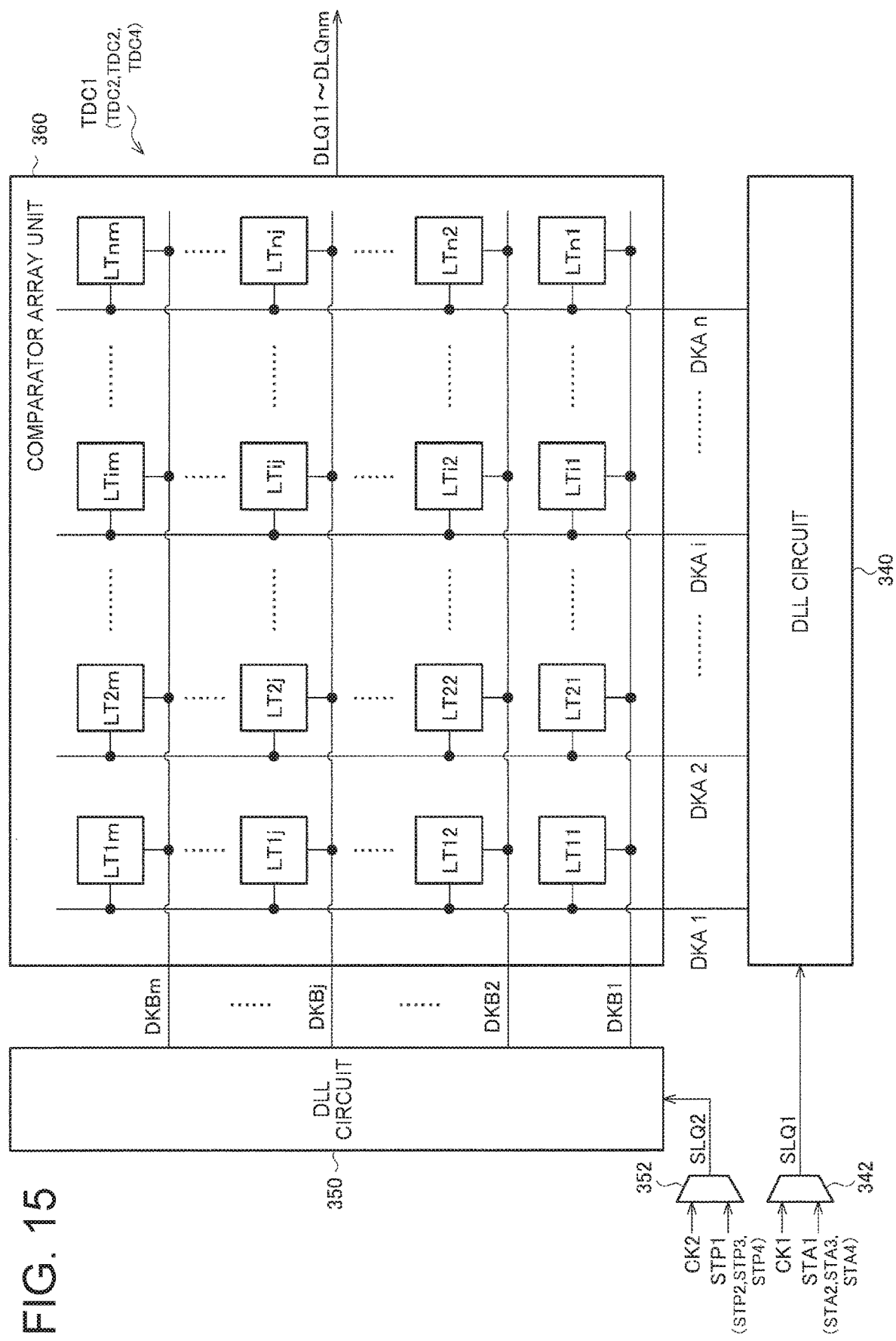
FIG. 15 illustrates a second modification example of the time-to-digital converter.

The time-to-digital converters TDC1 to TDC4 may be a passive type circuit that does not spontaneously generate the signal STA. FIGS. 14 and 15 illustrate configuration examples of the passive type time-to-digital converter TDC1 as first and second modification examples of the embodiment. The time-to-digital converters TDC2 to TDC4 can be configured in the similar manner. In TDC2 to TDC4, the signal STA1 in FIGS. 14 and 15 may be replaced with STA2 to STA4, and the signal STP1 may be replaced with STP2 to STP4.

The time-to-digital converter TDC1 in FIG. 14 includes an adjustment circuit 320, a delay locked loop (DLL) circuit 310, a selector 312, and a phase comparator circuit 330. The DLL circuit 310 includes a plurality of delay elements DE1 to DEn. In a first mode, the clock signal CK1 is selected and the clock signal CK1 is input to the DLL circuit 310 as a signal SLQ. The adjustment circuit 320 performs adjustment based on delayed clock signals DLCK1 to DLCKn from the delay element DE1 to DEn and the clock signal CK2 such that a delay amount in each of the delay element satisfies $\Delta t = |1/f1 - 1/f2|$. Each of the delay elements DE1 to DEn includes a buffering circuit, and a variable capacitor connected to an output node of the buffering circuit or a variable current source that supplies a current to the buffering circuit. If the adjustment circuit 320 adjusts the capacitance value of the variable capacitor or the current value of the variable current source by using control signals SCT1 to SCTn, the delay amount in each of the delay elements is adjusted to satisfy $\Delta t=|1/f1-1/f2|$. In a second mode, the selector 312 selects the signal STA1 and the signal STA1 is input to the DLL circuit 310 as the signal SLQ. Phase comparators LT1 to LTn in the phase comparator circuit 330 compare phases of the delayed clock signals DLCK1 to DLCKn from the DLL circuit 310 to the phase of the signal STP1. In a case where the transition timing of the signal STP1 is between the delayed clock signals DLCKi−1 and DLCKi, an output signal LQi of the phase comparator LTi is active. Thus, the time difference TDF1 in transition timing between the signals STA1 and STP1 can be specified as, for example, i×t, and time-digital conversion at resolution of $\Delta t=|1/f1-1/f2|$ is possible.

FIG. 15 illustrates an example of a 2D Vernier type. The time-to-digital converter TDC1 includes DLL circuits 340 and 350, selectors 342 and 352, and a comparator array unit 360. The DLL circuit 340 includes a plurality of delay elements similar to that in FIG. 14. Delayed clock signals DKA1 to DKAn from the plurality of delay elements are output to the comparator array unit 360. The DLL circuit 350 also includes a plurality of delay elements. Delayed clock signals DKB1 to DKBm from the plurality of delay elements are output to the comparator array unit 360. In the DLL circuits 340 and 350, feedback control is performed on a delayed time (delay amount) of the delay element based on an output of at least one of the plurality of delay elements and the delayed time of the delay element is locked to be a desired delayed time. The comparator array unit 360 includes phase comparators LT11 to LTnm of n columns and m rows. A digital value corresponding to the time difference between the signals STA and STP is obtained based on digital signals DLQ11 to DLQnm which are phase comparison results from the phase comparators LT11 to LTnm.

In the first mode, the selectors 342 and 352 select the clock signals CK1 and CK2, respectively. The clock signal CK1 is input to the DLL circuit 340 as a signal SLQ1, and the clock signal CK2 is input to the DLL circuit 350 as a signal SLQ2. In the DLL circuit 340, the delayed time of each of the delay elements is locked such that the total delayed time of the plurality of delay elements becomes a time TCK1 which corresponds to one period of the clock signal CK1. In the DLL circuit 350, the delayed time of each of the delay elements is locked such that the total delayed time of the plurality of delay elements becomes a time TCK2 which corresponds to one period of the clock signal CK2. The clock frequencies of the clock signals CK1 and CK2 are set to satisfy f1<f2 (TCK1>TCK2). The numbers n and m of stages of the delay elements in the DLL circuits 340 and 350 satisfy n=m=k, that is, are the same as each other, respectively. Thus, the delayed time DLA (TCK1/$k$) of the delay element in the DLL circuit 340 is longer than the delayed time DLB (TCK2/$k$) of the delay element in the DLL circuit 350. In the second mode, the signal STA1 is input to the DLL circuit 340 and the signal STP1 is input to the DLL circuit 350, by the selectors 342 and 352. The transition timing of the signal STA1 is ahead of the transition timing of the signal STP1. However, the delayed time DLA of the delay element in the DLL circuit 340 is longer than the delayed time DLB thereof in the DLL circuit 350. Thus, a time when the transition timing of the signal STA1 overtakes the transition timing of the signal STP1 is specified based on the digital signals DLQ11 to DLQnm from the comparator array unit 360, by the well-known method, and thus the digital value corresponding to the time difference between the signals STA1 and STP1 is obtained.

In the time-to-digital converter TDC1 in FIGS. 14 and 15, time-digital conversion is performed by using the clock signals CK1 and CK2 generated by using the resonators XTAL1 and XTAL2. Thus, performance of time-digital conversion is improved in comparison to a case of the method of the related art, which uses only the delayed time of the semiconductor element. In particular, there is an advantage that performance of time-digital conversion is further improved, or processing is simplified, by the synchronization circuit such as the PLL circuit performing phase synchronization between the clock signals CK1 and CK2.

7. Electronic Apparatus and Vehicle

Figure 16:
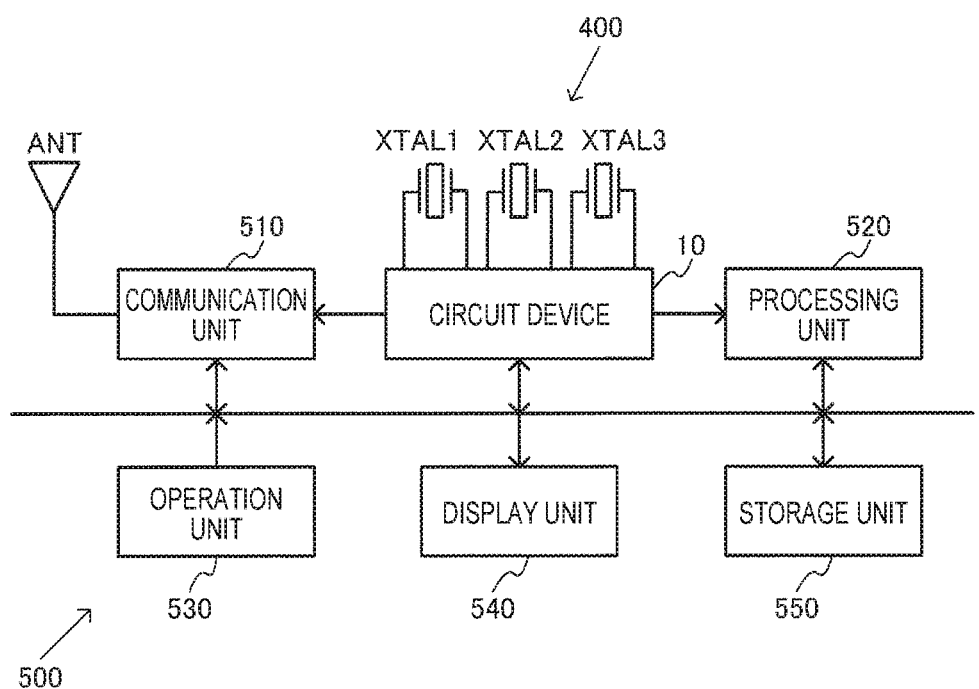
FIG. 16 illustrates a configuration example of an electronic apparatus.

FIG. 16 illustrates a configuration example of an electronic apparatus including the circuit device 10 in the embodiment. An electronic apparatus 500 includes the physical quantity measuring device 400 and a processing unit 520. The physical quantity measuring device 400 includes the circuit device 10 and the resonators XTAL1 to XTAL3. The electronic apparatus 500 may include a communication unit 510, an operation unit 530, a display unit 540, a storage unit 550, and an antenna ANT. As the electronic apparatus 500, for example, the followings can be assumed: a measuring device that measures the physical quantity such as a distance, a time, a flow rate, and a flow quantity; a biological information measuring device that measures biological information (ultrasonic measuring device, pulse wave meter, and the like); an in-vehicle device (device for automatic driving and the like); and a network-related device such as a base station or a router. In addition, the followings can be assumed: a wearable device such as a head-mounted display device or a clock-related device; a robot, a printing device, a projection device, a portable information terminal (such as a smartphone), a content providing device that distributes contents; and a video device such as a digital camera or a video camera.

The communication unit (wireless circuit) 510 performs processing of receiving data from the outside of the apparatus or transmitting data to the outside, via the antenna ANT. The processing unit (processing circuit) 520 performs control processing of the electronic apparatus 500 or various kinds of digital processing of data transmitted and received via the communication unit 510. The function of the processing unit 520 may be realized by a processor such as a microcomputer, for example. The operation unit 530 is used when a user performs an input operation. The operation unit 530 may be realized by an operation button, a touch panel display, and the like. The display unit 540 displays various kinds of information and may be realized by a display of liquid crystal, organic EL, or the like. The storage unit 550 stores data. The function thereof may be realized by a semiconductor memory (such as a RAM or a ROM), an HDD (hard disk drive), or the like.

Figure 17:
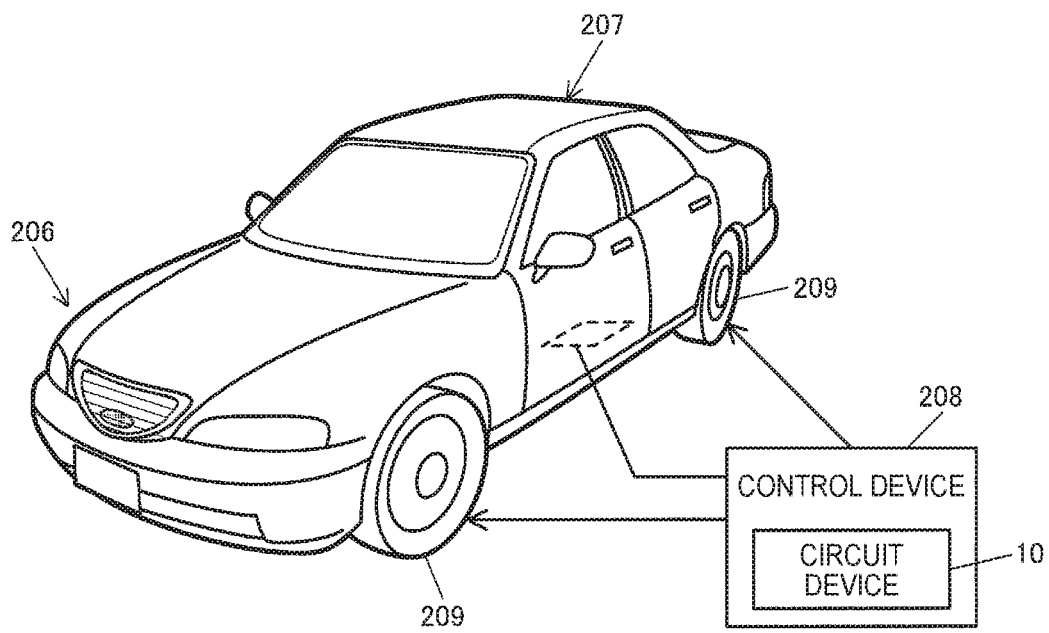
FIG. 17 illustrates a configuration example of a vehicle.

FIG. 17 illustrates an example of a vehicle including the circuit device (physical quantity measuring device) in the embodiment. The circuit device 10 in the embodiment can be incorporated into, for example, various vehicles such as cars, airplanes, motorcycles, bicycles, robots, and ships. The vehicle is an apparatus or a device that includes a driving mechanism such as an engine and a motor, a steering mechanism such as a steering wheel and a rudder, and various kinds of electronic apparatuses (in-vehicle apparatuses) and moves on the ground, the sky, or the sea. FIG. 17 schematically illustrates an automobile 206 as a specific example of the vehicle. The physical quantity measuring device (not illustrated) which includes the circuit device 10 and the resonator in the embodiment is incorporated into the automobile 206. A control device 208 performs various kinds of control processing based on physical quantity information measured by the physical quantity measuring device. For example, in a case where distance information of an object around the automobile 206 is measured as the physical quantity information, the control device 208 performs various kinds of control processing for automatic driving, by using the measured distance information. The control device 208 controls the hardness of a suspension in accordance with the posture of a vehicle body 207 or controls the break for each wheel 209. A device into which the circuit device 10 in the embodiment is incorporated is not limited to such a control device 208. The circuit device 10 can be incorporated into various devices provided in a vehicle such as the automobile 206 or a robot.

Hitherto, the embodiment is specifically described. However, those skilled in the related art can easily understand that many modifications can be made without substantially departing from the novel matters and effects of the invention. Thus, all such modification examples are included in the scope of the invention. For example, in the specification or the drawings, a term described together with a different term which is broader, or equivalent can be replaced with the different term at any point in the specification or the drawings, at least once. In addition, all combinations of the embodiment and the modification examples are included in the scope of the invention. The configurations and the operations of the circuit device, the physical quantity measuring device, the electronic apparatus, and the vehicle, and the like are not limited to those described in the embodiment, and various modifications may be made.

The entire disclosure of Japanese Patent Application No. 2017-145069, filed Jul. 27, 2017 is expressly incorporated by reference herein.

What is claimed is:

1. A circuit device comprising:
    an analog front-end circuit that receives a target signal; and
    a processing circuit that performs arithmetic processing based on an output signal from the analog front-end circuit,
    wherein the analog front-end circuit includes first to n-th comparator circuits that compare a voltage level of the target signal to first to n-th threshold voltages (where n is an integer of 2 or greater) and output n comparison result signals, wherein the n comparison result signals indicate respective times at which the voltage level exceeds the first to n-th threshold voltages, and
    the processing circuit obtains a transition timing of the target signal based on (i) a difference between the respective times at which the voltage level exceeds the first to n-th threshold voltages and (ii) delayed-time information of the analog front-end circuit, wherein the delayed-time information includes a correction value indicating a delay between the target signal input to the analog front-end circuit and a delayed signal sampled within the analog front-end circuit, and wherein the processing circuit is configured to obtain the correction value using the difference between the respective times and obtain the transition timing of the target signal by applying the correction value to a transition timing of the delayed signal.

2. The circuit device according to claim 1,
    wherein the processing circuit
    obtains time-voltage characteristic information based on the n comparison result signals, the time-voltage characteristic information indicating characteristics of voltage change of the target signal with time, and
    obtains the delayed-time information based on the time-voltage characteristic information.

3. The circuit device according to claim 1,
    wherein the analog front-end circuit includes a measurement circuit that measures a measurement voltage based on the voltage level of the target signal, at a transition timing of at least one of the n comparison result signals, and
    the processing circuit obtains the delayed-time information based on the measurement voltage.

4. The circuit device according to claim 2,
    wherein the analog front-end circuit includes a measurement circuit that measures a measurement voltage based on the voltage level of the target signal, at a transition timing of at least one of the n comparison result signals, and
    the processing circuit obtains the delayed-time information based on the measurement voltage.

5. The circuit device according to claim 3,
    wherein the measurement circuit includes
    a sampling circuit that performs sampling on the voltage level of the target signal at a transition timing of an i-th comparison result signal (i is an integer of 1 to n), and
    an A/D conversion circuit to which the voltage level subjected to sampling by the sampling circuit and an i-th threshold voltage are input, and that performs A/D conversion on a differential voltage between the voltage level subjected to sampling by the sampling circuit and the i-th threshold voltage, as the measurement voltage.

6. The circuit device according to claim 4,
    wherein the measurement circuit includes
    a sampling circuit that performs sampling on the voltage level of the target signal at a transition timing of an i-th comparison result signal (i is an integer of 1 to n), and
    an A/D conversion circuit to which the voltage level subjected to sampling by the sampling circuit and an i-th threshold voltage are input, and that performs A/D conversion on a differential voltage between the voltage level subjected to sampling by the sampling circuit and the i-th threshold voltage, as the measurement voltage.

7. The circuit device according to claim 5,
    wherein the measurement circuit includes a selector that selects any of the n comparison result signals as the i-th comparison result signal.

8. The circuit device according to claim 6,
    wherein the measurement circuit includes a selector that selects any of the n comparison result signals as the i-th comparison result signal.

9. The circuit device according to claim 1,
    wherein a j-th comparator circuit (j is an integer of 1 to n) includes
    a capacitor having one end to which a j-th threshold voltage is input in an initialization period and the target signal is input in a comparison period, and an amplifier circuit connected to the other end of the capacitor.

10. The circuit device according to claim 9,
wherein the amplifier circuit includes
an inverter, and
a switch that connects an output and an input of the inverter in the initialization period and does not connect the output and the input of the inverter in the comparison period.

11. The circuit device according to claim 1,
wherein the analog front-end circuit includes a first-signal comparator circuit that compares a first signal to a threshold voltage, and
the processing circuit includes
first to n-th time-to-digital converters that convert time differences in transition timings between an output signal from the first-signal comparator circuit and the n comparison result signals, to digital values and output n time-digital conversion values, and
an arithmetic circuit that obtains a time difference in transition timing between the first signal and a second signal as the target signal, based on the n time-digital conversion values and the delayed-time information.

12. The circuit device according to claim 11,
wherein, when a k-th time-digital conversion value is set as tk (k is an integer of 1 to n), an m-th time-digital conversion value is set as tm (m is an integer which is from 1 to n and is not equal to k), a k-th threshold voltage is set as Vthk, an m-th threshold voltage is set as Vthm, and the voltage level of the target signal at a transition timing of an m-th comparison result signal is set as Vsmp,
the analog front-end circuit includes a measurement circuit that measures Vos; Vos=Vsmp−Vthm,
the delayed-time information indicates that tc=Vos×(tm−tk)/(Vthm−Vthk), and
the arithmetic circuit obtains t0 as the transition timing of the target signal; t0=(Vthm×tk−Vthk×tm)/(Vthm−Vthk)−tc.

13. A physical quantity measuring device comprising:
the circuit device according to claim 1.

14. An electronic apparatus comprising:
the circuit device according to claim 1.

15. A vehicle comprising:
the circuit device according to claim 1.

* * * * *